(12) United States Patent
Arora et al.

(10) Patent No.: US 12,007,440 B1
(45) Date of Patent: Jun. 11, 2024

(54) SYSTEMS AND METHODS FOR SCAN CHAIN STITCHING

(71) Applicant: Cadence Design Systems, Inc., San Jose, CA (US)

(72) Inventors: Puneet Arora, Noida-Uttar Pradesh (IN); Subhasish Mukherjee, Noida-Uttar Pradesh (IN); Sarthak Singhal, Noida-Uttar Pradesh (IN); Christos Papameletis, Apex, NC (US); Brian Foutz, Charlottesville, VA (US); Krishna V Chakravadhanula, Vestal, NY (US); Ankit Bandejia, Greater Noida-Uttar Pradesh (IN); Norman Card, Vestal, NY (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 17/847,421

(22) Filed: Jun. 23, 2022

(51) Int. Cl.
*G01R 31/3185* (2006.01)
*G01R 31/317* (2006.01)
*G06F 11/267* (2006.01)
*G06F 30/333* (2020.01)
*G11C 29/32* (2006.01)

(52) U.S. Cl.
CPC ........... *G01R 31/318536* (2013.01); *G01R 31/318547* (2013.01); *G01R 31/31704* (2013.01); *G01R 31/3185* (2013.01); *G01R 31/318558* (2013.01); *G01R 31/318563* (2013.01); *G01R 31/318583* (2013.01); *G06F 11/267* (2013.01); *G06F 30/333* (2020.01); *G11C 29/32* (2013.01); *G11C 2029/3202* (2013.01)

(58) Field of Classification Search
CPC ...... G01R 31/31704; G01R 31/318536; G01R 31/318583; G01R 31/318558; G01R 31/3185; G01R 31/318563; G01R 31/318586; G01R 31/318547; G11C 2029/3202; G11C 29/32; G06F 30/333; G06F 11/267
See application file for complete search history.

(56) References Cited

U.S. PATENT DOCUMENTS

| | | | | |
|---|---|---|---|---|
| 8,719,651 B1* | 5/2014 | Dev | ............... | G01R 31/318583 716/108 |
| 2011/0307750 A1* | 12/2011 | Narayanan | ..... | G01R 31/318536 714/E11.055 |
| 2013/0185607 A1* | 7/2013 | Tekumalla | ..... | G01R 31/318536 714/E11.155 |

* cited by examiner

*Primary Examiner* — April Y Blair
*Assistant Examiner* — Sazzad Hossain
(74) *Attorney, Agent, or Firm* — Foley & Lardner LLP

(57) ABSTRACT

This disclosure relates scan chain stitching. In one example, scan chain elements from a scan chain element space can be received for a scan chain partition. The scan chain elements can be grouped based on scan chain element grouping criteria to form scan chain groups. Scan chain data identifying a number of scan chains for the scan chain partition can be received. The scan chains can be scan chain balanced across the scan chain groups to assign each scan chain to one of the scan chain groups. The scan chain elements associated with each scan chain of the scan chains can be scan chain element balanced. Scan chain elements for each associated scan chain can be connected to form a scan chain data test path during a generation of scan chain circuitry in response to the scan chain element balancing.

20 Claims, 19 Drawing Sheets

508 →

| Avg:10 | Avg:28 | Avg:35 | Avg:15 | Avg:22 | Avg:20 |
| Group G1 | Group G2 | Group G3 | Group G4 | Group G5 | Group G6 |
| 10 Flops | 28 Flops | 35 Flops | 15 Flops | 22 Flops | 20 Flops |
| C1 | C2 | C3, C7 | C4 | C5 | C6 |

| Avg:10 | Avg:28 | Avg:17.5 | Avg:15 | Avg:22 | Avg:20 |
| Group G1 | Group G2 | Group G3 | Group G4 | Group G5 | Group G6 |
| 10 Flops | 28 Flops | 35 Flops | 15 Flops | 22 Flops | 20 Flops |
| C1 | C2, C8 | C3, C7 | C4 | C5 | C6 |

| Avg:10 | Avg:14 | Avg:17.5 | Avg:15 | Avg:22 | Avg:20 |
| Group G1 | Group G2 | Group G3 | Group G4 | Group G5 | Group G6 |
| 10 Flops | 28 Flops | 35 Flops | 15 Flops | 22 Flops | 20 Flops |
| C1 | C2, C8 | C3, C7 | C4 | C5, C9 | C6 |

| Avg:10 | Avg:14 | Avg:17.5 | Avg:15 | Avg:11 | Avg:20 |
|---|---|---|---|---|---|
| Group G1 | Group G2 | Group G3 | Group G4 | Group G5 | Group G6 |
| 10 Flops | 28 Flops | 35 Flops | 15 Flops | 22 Flops | 20 Flops |
| C1 | C2, C8 | C3, C7 | C4 | C5, C9 | C6, C10 |

| Avg:10 | Avg:14 | Avg:17.5 | Avg:15 | Avg:11 | Avg:10 |
|---|---|---|---|---|---|
| Group G1 | Group G2 | Group G3 | Group G4 | Group G5 | Group G6 |
| 10 Flops | 28 Flops | 35 Flops | 15 Flops | 22 Flops | 20 Flops |
| C1 | C2, C8 | C3, C7, C11 | C4 | C5, C9 | C6, C10 |

| Avg:10 | Avg:14 | Avg:11.6 | Avg:15 | Avg:11 | Avg:10 |
|---|---|---|---|---|---|
| Group G1 | Group G2 | Group G3 | Group G4 | Group G5 | Group G6 |
| 10 Flops | 28 Flops | 35 Flops | 15 Flops | 22 Flops | 20 Flops |
| C1 | C2, C8 | C3, C7, C11 | C4, C12 | C5, C9 | C6, C10 |

| Avg:10 | Avg:14 | Avg:11.6 | Avg:7.5 | Avg:11 | Avg:10 |
| --- | --- | --- | --- | --- | --- |
| Group G1 10 Flops | Group G2 28 Flops | Group G3 35 Flops | Group G4 15 Flops | Group G5 22 Flops | Group G6 20 Flops |
| C1 | C2, C8, C13 | C3, C7, C11 | C4, C12 | C5, C9 | C6, C10 |

| Avg:10 | Avg:9.3 | Avg:11.6 | Avg:7.5 | Avg:11 | Avg:10 |
| --- | --- | --- | --- | --- | --- |
| Group G1 10 Flops | Group G2 28 Flops | Group G3 35 Flops | Group G4 15 Flops | Group G5 22 Flops | Group G6 20 Flops |
| C1(10) | C2(10), C8(9), C13(9) | C3(12), C7(12), C11(11) | C4(8), C12(7) | C5(11), C9(11) | C6(10), C10(10) |

```
set ListA [report_dft_partitions --partition A --scan_elements]
set ListB [report_dft_partitions --partition B --scan_elements]
```
~ 3002

```
set_db [get_db insts *ECO*] .dft_scan_type ECO
set_db [get_db scan_segments *ECO*] .dft_scan_type ECO define_scan_group --dft_scan_type "ECO" --partition A --dft_cfg_mode COMPRESSION_INTEST
define_scan_group --dft_scan_type {IB OB} --partition A --dft_cfg_mode COMPRESSION_INTEST
define_scan_group --dft_scan_type {all} --partition A --constraints {by_power_domain} --dft_cfg_mode COMPRESSION_INTEST define_scan_group --dft_scan_type "ECO" --partition B --dft_cfg_mode COMPRESSION_INTEST
define_scan_group --dft_scan_type {IB OB} --partition B --dft_cfg_mode COMPRESSION_INTEST
define_scan_group --dft_scan_type {all} --partition B --constraints {by_power_domain} --dft_cfg_mode COMPRESSION_INTEST
```
~ 3004

```
define_scan_group --dft_scan_type {IB OB} --partition A --dft_cfg_mode COMPRESSION_EXTEST
define_scan_group --dft_scan_type {IB OB} --partition B --dft_cfg_mode COMPRESSION_EXTEST
```
~ 3006

```
connect_scan_chains --partition A --dft_cfg_mode COMPRESSION_INTEST
connect_scan_chains --partition B --dft_cfg_mode COMPRESSION_INTEST connect_scan_chains --partition A --dft_cfg_mode COMPRESSION_EXTEST
connect_scan_chains --partition B --dft_cfg_mode COMPRESSION_EXTEST
```
~ 3008

FIG. 30

SYSTEMS AND METHODS FOR SCAN CHAIN STITCHING

TECHNICAL FIELD

The present disclosure relates to systems and methods for a multi-mode scan stitching architecture.

BACKGROUND

Electronic design automation (EDA), also referred to as electronic computer-aided design (ECAD), is a category of software tools for designing electronic systems such as integrated circuit (IC) chips and printed circuit boards. The tools work together in a design flow that IC chip designers use to design and analyze entire semiconductor chips. Since a modern semiconductor chip can have billions of components, EDA tools are essential for the design of IC chips. As IC chip complexity increases, meeting the testing requirements for acceptable quality assurance is becoming increasingly difficult.

ATPG (an acronym for both Automatic Test Pattern Generation and Automatic Test Pattern Generator) is an electronic design automation method/technology used to find an input (or test) sequence that, when applied to a circuit, enables automatic test equipment to distinguish between the correct circuit behavior and the faulty circuit behavior caused by defects. The generated patterns are used to test semiconductor devices after manufacture or to assist with determining the cause of failure. The effectiveness of ATPG systems is measured by the number of modeled defects, or faults, detectable and by the number of generated patterns. These metrics generally indicate test quality (higher with more fault detections) and test application time (higher with more patterns). ATPG efficiency is another consideration that is influenced by the fault model under consideration, the type of circuit under test (full scan, synchronous sequential, or asynchronous sequential), the level of abstraction used to represent the circuit under test (gate, register-transfer, switch), and the required test quality.

Scan chains are the elements in scan-based designs of IC chips that are used to shift-in and shift-out test data. A scan chain is formed by a number of observable scan flops connected back to back in a chain with the output of one observable scan flop connected to another. The input of a first observable scan flop is connected to the input pin of the chip (called scan-in) from where scan data is fed. The output of the last observable scan flop is connected to the output pin of the chip (called scan-out) which is used to observe or measure the data shifted out. Output pins of the IC chip can be directly observed with automatic test equipment (ATE).

SUMMARY

In an example, a method can include receiving scan chain elements from a scan chain element space for a scan chain partition, grouping the scan chain elements based on scan chain element grouping criteria to form scan chain groups, receiving scan chain data identifying a number of scan chains for the scan chain partition, scan chain balancing the scan chains across the scan chain groups to assign each scan chain to one of the scan chain groups, scan chain element balancing scan chain elements associated with each scan chain of the scan chains, and connecting scan chain elements for each associated scan chain to form a scan chain data test path during a generation of scan chain circuitry in response to the scan chain element balancing.

In yet another example, a system can include a non-transitory computer-readable medium that can be configured to store data and instructions. The system includes a processor that can be configured to access the non-transitory computer-readable medium and execute the instructions. The instructions can include a scan chain element grouping module that can be programmed to group scan chain elements based on scan chain element grouping criteria to form scan chain groups, a scan chain balancing module that can be programmed to generate balanced scan chain data characterizing scan chain elements that have been balanced across associated scan chain groups based on scan chain data and scan chain element grouping criteria received at a user input device, and a scan chain stitching module that can be programmed to stitch scan chain elements for each associated scan chain to form a respective scan chain data test path based on the balanced scan chain data during a generation of scan chain circuitry for a user design.

In a further example, a non-transitory machine readable medium can have machine executable instructions that can include a scan chain tool. The scan chain tool can include a scan chain element grouping module that can group scan chain elements based on scan chain element grouping criteria to form scan chain groups, and a scan chain balancing module that can scan chain balance the scan chains across the scan chain groups to assign each scan chain to one of the scan chain groups, and scan chain element balance scan chain elements associated with each scan chain of the scan chains. The scan chain tool can further include a scan chain stitching module that can stitch scan chain elements for each associated scan chain to form a scan chain data test path during a generation of scan chain circuitry in response to the scan chain element balancing.

BRIEF DESCRIPTION OF THE DRAWINGS

FIGS. 5-15 is an example of a method for scan chain balancing scan chain groups across scan chains.

FIG. 30 is an example of a portion of pseudocode that can be implemented by a scan chain tool.

DETAILED DESCRIPTION

Figure 1:
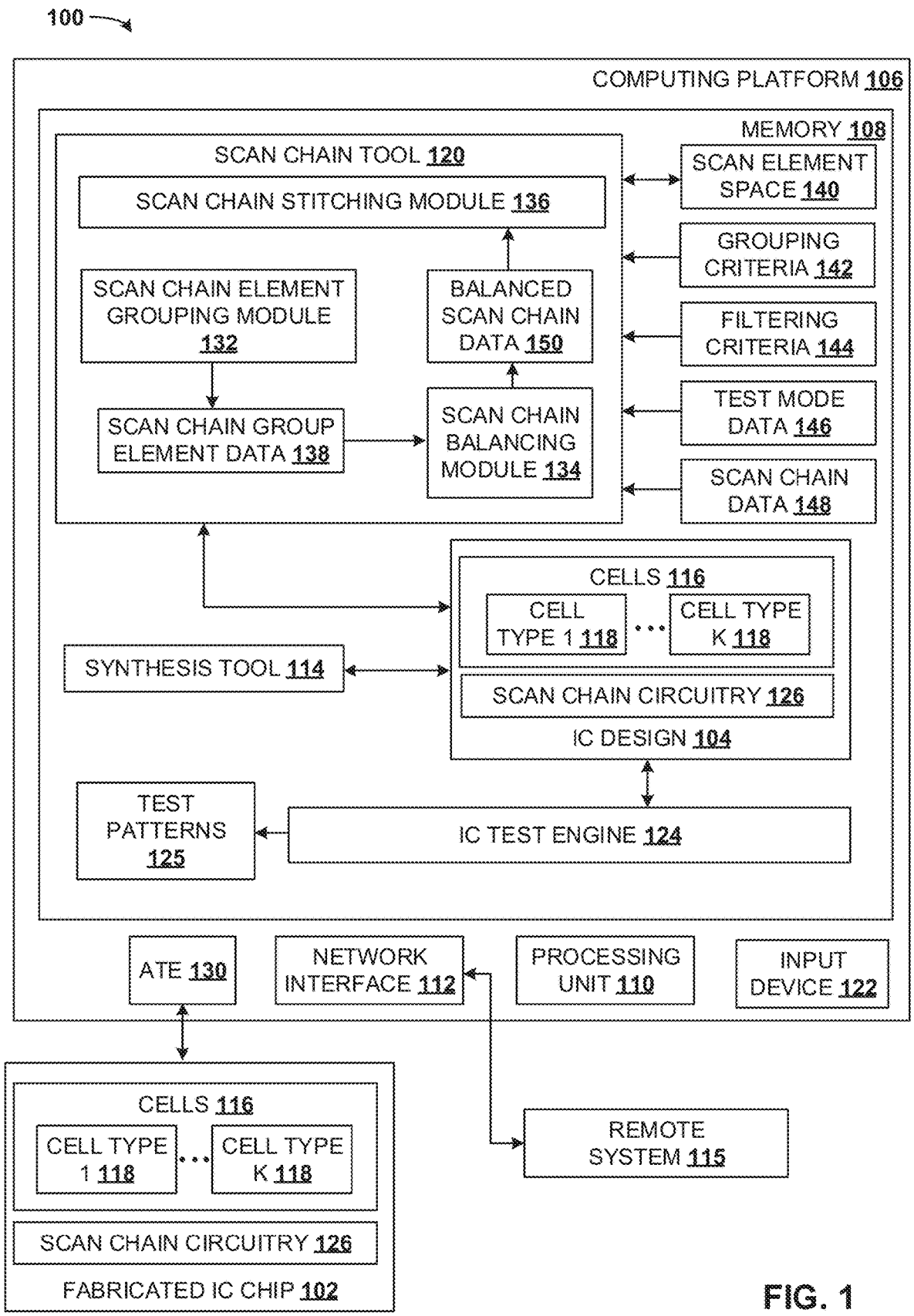
FIG. 1 illustrates an example of a system for testing a fabricated IC chip based on an IC design.

With an increase in IC (e.g., system on chip (SoC)) size and complexity, constraints to stitch scan chains are also becoming complex. Constraints impacting scan stitching can include multiple partitions, power domains, clock domains, shift enable signals, and multiple test modes. The type of scan chain elements that may need dedicated scan chains and special handling are also increasing. Moreover, similar scan chain elements may need dedicated scan chains in a respective test mode while also being shared with other elements in another test mode. For example, Input Bounding (IB) and Output Bounding (OB) IEEE wrappers need to have dedicated scan chains in a select test mode.

Similarly, there can be other custom scan chain elements like retention cells/DFT-Macro flops (e.g., on-product clock generation (OPCG) and logic built-in-self-test (LBIST)) which may need a dedicated scan chain in a given test mode. In other test modes, these scan chain elements can be combined into a single scan chain. Moreover, each test mode can have a different number of scan chains allocated to it with a different scan chain length. Generally, during IC design, a user determines a length of scan chain elements (each element can be of length more than one element, such as a flip flop) and allocates each type of scan chain element to respective scan chains in each test mode so that the scan chains are balanced in each test-mode.

In some examples, different test modes such as compression mode, full scan mode, and serial mode can have different test mode constraints. For example, in some test modes, clock domains are shared, power domains are shared, or both. Some EDA solutions use user scripting to create correct scan chains (e.g., scan chain element assigning and balancing) and necessitate the user to determine how different scan chain elements are assigned and to balance the scan chains. Such EDA solutions are not only time-consuming but also error-prone.

Systems and methods are described herein that enable users to configure scan chain circuitry designs for scan chain connections. The techniques described herein eliminate a need for user scripting and thus manual intervention from a user side for allocating scan chain elements and scan chain balancing across different test modes. In some examples, the systems and methods described herein can be embodied as machine readable instructions that can define a software plugin or tool that can be activated by the user to allocate the scan chain elements to scan chains and balance the scan chain elements across the scan chains. Additionally, the systems and methods described herein can be used to reduce a number of multi-mode mux elements inserted into a scan chain circuitry during scan chain design which can reduce an overall area overhead for the scan chain circuitry and provide improved Quality of Results (QoR). This is because a scan wire length can be reduced as a number of scan chain break points can be less.

Thus, the systems and methods described herein provide a technique for modeling multi-mode scan architectures such that scan chain elements can be part of different scan chains during different test modes with different testing constraints. The system and methods described herein can define and associate scan groups for different test modes to similar or different scan chains such that a user can more readily understand and handle multi-mode scan chains. Additionally, the systems and methods described herein provide flexibility and scalability such that scan chain elements can be marked as custom scan chain elements for a particular implementation. A provision of search space, application of filters to further refine elements, capability to include/exclude elements, and application of constraints on the set of scan chain elements to divide said scan chain elements into scan groups provides a scalable and effective technique that can be used during scan chain construction. Additionally, the systems and methods described herein can be used for indexing scan chains in lower-level test modes for higher-order test modes to further reduce the number of multi-mode mux elements that are part of the scan chain circuitry. In some examples, as described herein, back-to-back multi-mode mux elements can be combined to further reduce the number of multi-mode mux elements that are part of the scan chain circuitry.

FIG. 1 illustrates an example of a system 100 for testing a fabricated IC chip 102 that is based on an IC design 104. The system 100 can include a computing platform 106. The computing platform 106 can include memory 108 for storing machined readable instructions and data and a processing unit 110 for accessing the memory 108 and executing the machine-readable instructions. The memory 108 represents a non-transitory machine-readable memory (or other medium), such as random access memory (RAM), a solid state drive, a hard disk drive, or a combination thereof. The processing unit 110 can be implemented as one or more processor cores. The computing platform 106 can include a network interface 112 (e.g., a network interface card) configured to communicate with other computing platforms via a network, such as a public network (e.g., the Internet), a private network (e.g., a local area network (LAN)) or a combination thereof (e.g., a virtual private network).

The computing platform 106 could be implemented in a computing cloud. In such a situation, features of the computing platform 106, such as the processing unit 110, the memory 108, and the network interface 112 could be representative of a single instance of hardware or multiple instances of hardware with applications executing across multiple of instances (e.g., distributed) of hardware (e.g., computers, routers, memory, processors, or a combination thereof). Alternatively, the computing platform 106 could be implemented on a single dedicated server or workstation.

The IC design 104 can be stored in the memory 108 of the computing platform 106. The IC design 104 can be implemented, for example, as design specifications for an IC chip. The IC design 104 can be generated with an EDA application, such as a synthesis tool 114. The synthesis tool 114 can be implemented as application software or a software module. In the example of FIG. 1, the synthesis tool 114 is executed on the computing platform 106, however, in other examples, the synthesis tool 114 is executed on a remote system 115. For instance, an end-user of the EDA application can employ a user-interface to generate and/or modify hardware description language (HDL) code (e.g., Verilog) for generating a register-transfer level (RTL) model (e.g., RTL code) characterizing a circuit. The RTL model can be transformable by the synthesis tool 114 into a physically realizable gate-level netlist for the IC design 104.

The fabricated IC chip 102 can represent a physically instantiated version of the IC design 104. More particularly, the fabricated IC chip 102 and the IC design 104 can include cells 116. Each of the cells 116 can represent a group of transistors and intercoupled structures that provides a Boolean logic function (e.g., AND, OR, NOR, NAND, XOR, XNOR, inverters) or a storage function (e.g., flip flop or latch). The cells 116 of the fabricated IC chip 102 represent physically instantiated versions of the cells 116 of the IC design 104. Thus, the cells 116 of the IC design 104 and the cells 116 of the fabricated IC chip 102 employ the same reference numbers. In many instances, there can be virtually any number of cells 116 (e.g., hundreds, thousands or millions). In the present example, there are a K number of different cell types 118 of the cells 116, where K is an integer greater than or equal to one. Additionally, there are an R number of cell instances for each of the K number of cell types 118, where R is an integer greater than or equal to one.

Each cell instance represents a specific instantiation in the IC design 104 for a corresponding cell type 118. Moreover, there can be a different (or the same) number of cell instances for each of the K number of cell types 118. The IC design 104 has a variety of cell types 118 based on the architecture of the IC design 104 and the specific operating environment in which the fabricated IC chip 102 is designed to operate. In some examples, the fabricated IC chip 102 can include an interface that enables external systems to provide stimuli to the components of the fabricated IC chip 102, including the cells 116 of the fabricated IC chip 102. The interface can conform to the standards set forth in the IEEE 1149.1 standards, IEEE 1149.6 standards, and can be implemented with PCI, wafer probes, etc.

In some examples, the memory 108 includes a scan chain tool 120. The scan chain tool 120 can be programmed to implement scan chain stitching according to the examples described herein. In some examples, the scan chain tool 120 can be invoked based on user input at an input device 122 of the computing platform 106. In additional or alternative examples, the scan chain tool 120 can be implemented as or part of an ATPG tool. In even further examples, the scan chain tool 120 can be implemented as part of the synthesis tool 114.

The memory 108 includes an IC test engine 124 which can be implemented as application software or a software module. In the example of FIG. 1, the IC test engine 124 is implemented on the computing platform. In other examples, the IC test engine 124 can be implemented at the remote system 115. The IC test engine 124 is configured to execute Automatic Test Pattern Generation (ATPG) techniques to provide test patterns 128 based on the IC design 104. The IC test engine 124 can provide test patterns 128 that are employable for testing the fabricated IC chip 102. In some examples, the test patterns 125 are employable by scan chain circuitry 126 (e.g., can be generated by an on-chip pattern generator, such as the PRPG) to test the fabricated IC chip 102. In other examples, the test patterns 128 are employable by Automatic Test Equipment (ATE) 130 to test the fabricated IC chip 102. In some examples, the test patterns 128 are stored in the memory 108 and/or the ATE 130 prior to execution of the testing. The ATE 130 can alternatively be referred to as an IC chip tester or an IC chip tester machine. The ATE 130 can be implemented as a hardware device that is electrically coupled to pins on the fabricated IC chip 102. In these examples, such pins can be coupled to the interface of the fabricated IC chip 102.

The test patterns 128 employed by the ATE 130 contain stimuli to be applied to inputs and the expected values on the outputs of the fabricated IC chip 102. The ATE 130 is configured such that if the measured value by the ATE 130 is different from the expected value specified in the test patterns 128, the ATE 130 stores the failure data. The failure data can be sent to the IC test engine 124 to determine a cause of one or more failures in the fabricated IC chip 102. In situations where an application of the test patterns 128 indicates that the fabricated IC chip 102 is operating properly (e.g., within acceptable tolerances), the fabricated IC chip 102 can be approved for deployment. In situations where the application of the test patterns 128 indicates that the fabricated IC chip 102 is not operating properly (e.g., within tolerances), the fabricated IC chip 102 can be rejected, such that the fabricated IC chip 102 is not deployed.

The fabricated IC chip 102 and the IC design 104 can include the scan chain circuitry 126, as shown in FIG. 1. The scan chain circuitry 126 can include a number of scan chains for testing operations of functional logic (e.g., of one or more cells of the cells 116). The number of chains for each functional logic and how said functional logic is tested can be determined by the scan chain tool 120. In some examples, the IC design 104 can include an LBIST and a pattern generator (e.g., a PRPG) for generating test patterns that are to be propagated along the scan chains during testing operations of functional logic (e.g., of one or more cells of the cells 116) of IC design 104.

Continuing with the example of FIG. 1, the scan chain tool 120 includes a scan chain element grouping module 132, a scan chain balancing module 134, and a scan chain stitching module 136. The scan chain element grouping module 132 can be programmed to provide scan chain group element data 138 based at least on user input at the input device 122 and scan chain element space 140. The scan chain element space 140 can correspond to data identifying scan chain elements that can be in some instances associated with different scan chain partitions and test modes. The test modes can include a compression mode, a full scan mode, and a serial mode. The compression mode can be used during production testing of the IC design 104 (or the fabricated IC chip 102), the full scan mode can be used during debugging testing of the IC design 104 (or the fabricated IC chip 102), and the serial mode can be used during stress testing of the IC design 104 (or the fabricated IC chip 102). In some examples, the compression mode can be referred to herein as mode 1, the full scan mode can be referred to herein as mode 2, and the serial mode can be referred to herein as mode 3. Thus, the scan chain circuitry 126 can be operated in different test modes, such as the modes 1, 2, and 3.

The scan chain element space 140 can correspond to data identifying scan chain elements for a respective test mode. In some examples, the scan chain elements for the respective test mode (e.g., the mode 1) can be also for a different test mode (e.g., the mode 2) and thus can be shared among scan chains for different test modes. Each scan chain element in the scan chain element space 140 can have a respective scan chain length and thus can use a given number of clock cycles for shifting data from an input to a respective scan chain element to an output of the respective scan chain element.

The scan chain element grouping module 132 can be programmed to retrieve scan chain elements from the scan chain element space 140 based on the user input at the input device 122. A user can employ the input device 122 to provide scan chain element grouping criteria 142. The scan chain element grouping criteria 142 can identify power domains, clock domains, clock edges (e.g., rising or falling edges), or other types of criteria (e.g., which can be user-specified based on scan chain circuitry design) according to which the retrieved scan chain elements are to be grouped. Thus, in some examples, respective retrieves scan chain elements can be associated with similar or different power and clock domains. The scan chain element grouping module 132 can be programmed to create scan chain groups by grouping the scan chain elements for each scan chain partition based on scan chain element grouping criteria 142. Thus, the scan chain element grouping module 132 can be programmed to form scan chain groups that include one or more scan chain elements retrieved from the scan element space for one or more different test modes. The scan chain element grouping module 132 can be programmed to output the scan chain group element data 138 identifying each scan chain group. As described herein, scan chain elements of different scan chain groups can be stitched by the scan chain stitching module 136 in different scan chains enabling a user to build constraint-specific scan chains. Each test mode (e.g., design for testability (DFT) configuration mode or ATPG mode) can have multiple scan chain groups that can be stitched by the scan chain stitching module 136 during the generation of the scan chain circuitry 126.

In some examples, the scan chain element grouping module 132 can be programmed to retrieve scan chain elements from the scan chain element space 140 based on filtering criteria 144. The filtering criteria 144 can identify a respective scan chain partition that can be used during the generation of the scan chain circuitry 126. The filtering criteria 144 can include rules such as clock domain rules, power domain rules, scan type rules, and user-customizable rules. For example, if the filtering criteria 144 identifies a given power domain, the scan chain element grouping module 132 can be programmed to retrieve the scan chain elements associated with the given power domain in the scan chain element space 140. In some examples, the filtering criteria 144 can be provided based on user input at the input device 122.

In some examples, the scan chain element grouping module 132 can be programmed to receive test mode data 146. The test mode data 146 can define or identify one or more test modes such as described herein for the IC design 104 and thus the fabricated IC chip 102. In some examples, the test mode data 146 can be provided based on user input at the input device 122. The grouping of the scan chain elements from the scan chain element space 140 can be further based on the test mode data 146. In further examples, the scan chain element grouping module 132 can be programmed to receive user-created scan chain elements for grouping, such as a scan element for one or more engineering change orders (ECOs), which can be marked with particular attributes, based on the user input at the input device 122.

By way of further example, the scan chain element grouping module 132 can be programmed to provide the scan chain group element data 138 to the scan chain balancing module 134. In other examples, the scan chain balancing module 134 can be programmed to retrieve from the memory 108 the scan chain group element data 138. In some examples, the scan chain balancing module 134 can be programmed to receive scan chain data 148, which can be provided based on user input at the input device 122. The scan chain balancing module 134 can be programmed to assign each scan chain to one of the scan chain groups identified by the scan chain group element data 138. The scan chain balancing module 134 can be programmed to compute an average chain length for each scan chain group in response to assigning each scan chain. The scan chain balancing module 134 can be programmed to assign a subsequent scan chain from the remaining scan chains to a given scan chain group of the scan chain groups with a maximum average chain length. The scan chain balancing module 134 can be programmed to compute an updated average chain length for the given group. The scan chain balancing module 134 can be programmed to assign each scan chain to a corresponding scan chain group having a greatest average chain length until all scan chains have been assigned to a respective scan chain group. Thus, the scan chain balancing module 134 can be programmed to repeat the scan chain assigning and computing of an updated average scan chain for the given scan chain group until the scan chains have all been allocated.

The scan chain balancing module 134 can be further programmed to balance scan chain elements of each scan chain group across assigned scan chains to provide balanced scan chain data 150. The scan chain balancing module 134 can be programmed to assign scan chain elements of each scan chain group to associated scan chains in a round-robin order (e.g., circular order), or until each scan chain element of a respective group has been assigned to a given scan chain for the respective group. The balanced scan chain data 150 can characterize the balanced scan chain elements associated with assigned scan chain group. In some examples, the scan chain stitching module 136 can be programmed to stitch scan chain elements for each scan chain based on the balanced scan chain data 150. The scan chain stitching module 136 can be programmed to connect scan chain elements for each assigned scan chain to form a scan chain signal path for a given scan chain partition based on the balanced scan chain data 150 during the generation of the scan chain circuitry 126.

For example, the scan chain stitching module 136 can be programmed to stitch (e.g., connect by defining signal or data traces) separate scan chains for different power and/or clock domains during the generation of the scan chain circuitry 126 based on the balanced scan chain data 150. Thus, the scan chain stitching module 136 can be programmed to merge (e.g., connect) two or more power and/or clock domains while keeping other powers domains separate. In further examples, the scan chain stitching module 136 can be programmed to stitch separate scan chains for different edges, and/or separate scan chains for IEEE 1500 wrapper chains based on the balanced scan chain data 150. Thus, the scan chain stitching module 136 in some instances can segregate IB and OB wrapper scan chain segments (e.g., flip flops) in separate scan chains. By way of further example, if the user provides via the input device 122 user-defined scan chain elements, the scan chain stitching module 136 can be programmed to stitch one or more separate scan chains to include the custom scan chain elements. In some examples, the scan chain stitching module 136 or the scan chain tool 120 can be integrated with DFT partition support to handle multiple scan chain partitions and/or multiple codecs.

In some examples, the scan chain stitching module 136 during the generation of the scan chain circuitry 126 can be optimized to allocate multi-mode mux elements for connecting scan chain elements associated with different test modes. The scan chain stitching module 136 can be programmed to implement a multi-mode mux insertion method that re-uses scan chain elements from a lower-level test mode (e.g., the mode 1) for higher-order test modes (e.g., the modes 2 and/or 3).

For example, the scan chain stitching module 136 can be programmed to identify the lower-level test mode, such as the mode 1. The scan chain stitching module 136 can be programmed to index the scan chain elements assigned to each scan chain for the lower-level test mode. For example, each scan chain element can be assigned an index value. The index values can be used to identify one or more scan chain elements from the lower-level test mode that can be used in a similar arrangement in a higher-order test mode. For example, a set of neighboring scan chain elements from the lower-level test mode can be neighboring scan chain elements in the higher-order test mode based on respective assigned index values for these scan chain elements. The scan chain stitching module 136 can be programmed to identify the one or more neighboring scan chain elements from the lower-level test mode using respective assigned index values for similar arrangements in higher-order test modes. The scan chain stitching module 136 can be programmed to sort the scan chain elements for the scan chains for the lower-level test mode based on a respective assigned index value. In some examples, similar index scan chain elements can be sorted based on a length, clock, and/or hierarchy. Thus, at higher level test modes, such as the mode 2, the scan chain stitching module 136 can be programmed to reuse scan chain elements in indexed order from the lower-level test mode, such as the mode 1.

The scan chain stitching module 136 can be programmed to scan chain balance the assigned scan chain elements across respective scan chains for the higher-order test mode in some examples in a same or similar manner as described herein. The scan chain stitching module 136 can be programmed to insert multi-mode mux elements based on the scan chain balancing such that a lower number of multi-mode mux elements are used. Resultantly, the connectivity of scan chain elements can be improved. Thus, an overhead of the scan chain circuitry 126 can be reduced (or lowered) in contrast to existing approaches for allocating multi-mode mux elements. Existing approaches for multi-mode mux element allocation use scan chain circuit element sorting techniques for allocation that result in a higher number of multi-mode mux elements for a scan chain circuit design.

According to the examples herein, a reduced number of multi-mode mux elements are used in the scan chain circuitry 126 based on the assigned index values. The scan chain stitching module 136 can be programmed to insert a respective multi-mode mux element between two or more scan chain elements to enable the use of at least one of the scan chain elements during different test modes (e.g., the modes 1 and 2) based on a respective test mode signal received at the respective multi-mode mux element. Accordingly, multi-mode mux elements can be inserted in a more effective manner such that an overhead cost of the scan chain circuitry 126 can be reduced in contrast to existing approaches to enable different inputs for different test modes as test modes can have different scan-in and scan-out pins. Additionally, scan chain elements can be shared among the different test modes using the inserted multi-mux elements.

In some examples, the scan chain stitching module 136 can be programmed to merge neighboring (e.g., back to back) multi-mode mux elements into a single multi-mode mux element and insert the multi-mode mux element into the scan chain circuitry 126 with an OR gate element during generation of the scan chain circuitry 126. Thus, the scan chain stitching module 136 can be programmed to further reduce the overhead cost of the scan chain circuitry 126 by identifying multi-mode mux elements that can be merged into a single multi-mode mux element for OR gate element control.

Accordingly, the scan chain tool 120 enables users to configure scan chain circuitry designs for scan chain connections. The scan chain tool 120 eliminates a need for user scripting and thus manual intervention from a user side for allocating scan chain elements and scan chain balancing across different test modes as in existing approaches. By using the scan chain tool 120, a number of multi-mode mux elements for the scan chain circuitry 126 can also be reduced which reduces an overall area overhead for scan chain circuitry design and provides an improved QoS.

Furthermore, the scan chain tool 120 allows for modeling multi-mode scan architectures such that scan chain elements can be part of different scan chains during different test modes with different testing constraints. This is because the scan chain tool 120 can be programmed to define and associate scan groups for different test modes to same or different scan chains such that a user can more readily understand and handle multi-mode scans. The scan chain tool 120 provides flexibility and scalability such that scan chain elements can be marked as custom scan chain elements for a particular implementation. A provision of search space, application of filters to further refine elements, capability to include/exclude elements, and application of constraints on the set of elements to divide said elements into scan groups provide a scalable and effective technique to scan chain construction. Moreover, because the scan chain tool 120 implements an indexing scheme based on a lower-level test modes the scan chain tool 120 can be used to reduce a number of multi-mode mux elements that are implemented for the scan chain circuitry 126 further reducing the overall area overhead for the scan chain circuitry 126. In some examples, as described herein, back-to-back multi-mode mux elements can be combined by the scan chain tool 120 to even further reduce the number of multi-mode mux elements for the scan chain circuitry 126 leading to a footprint reduction of the scan chain circuitry 126.

Figure 2:
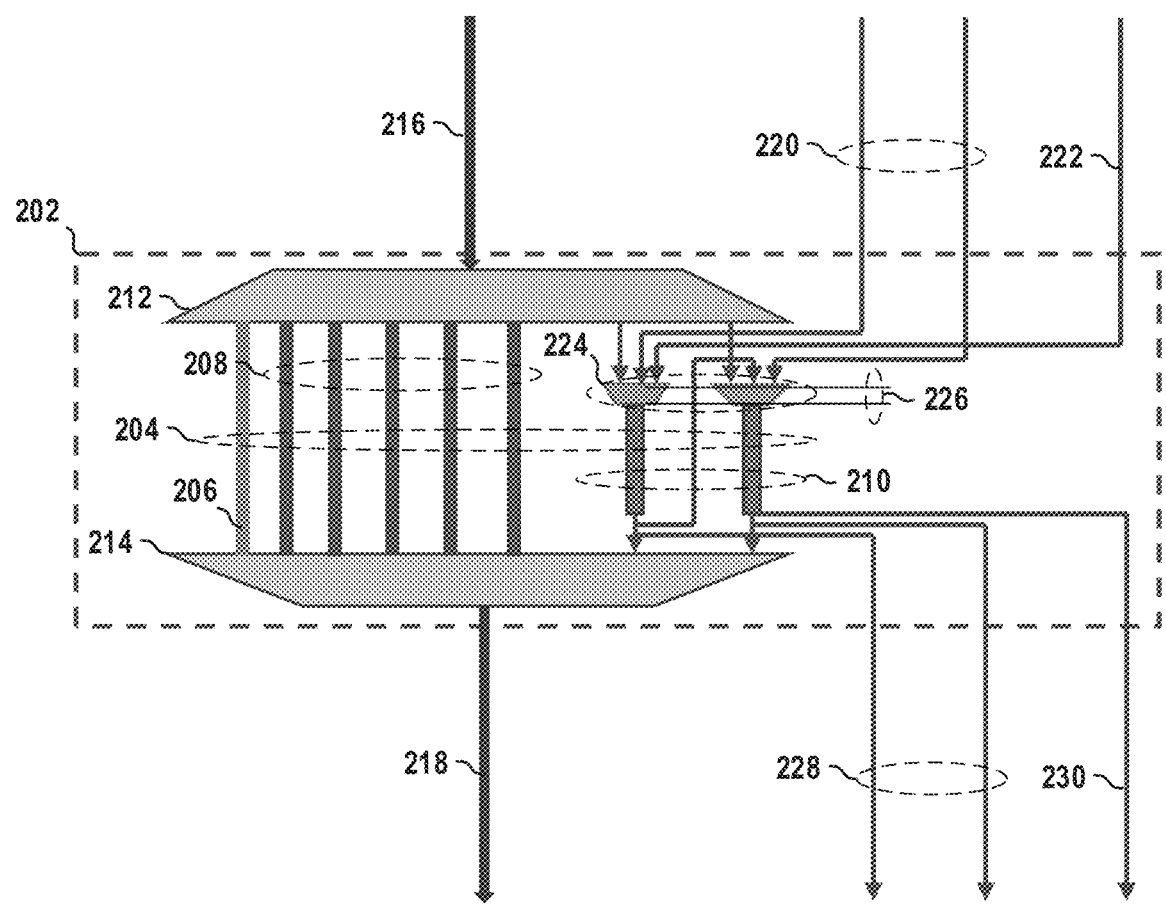
FIG. 2 illustrates an example of a partition of scan chain circuitry.

FIG. 2 illustrates an example of a partition 200 of scan chain circuitry, such as the scan chain circuitry 126, as shown in FIG. 1. Thus, reference can be made to the example of FIG. 1 in the example of FIG. 2. The partition 200 can be for a respective clock domain and can share power domains such as first and second power domains. The partition 200 can include a number of scan chains 204. The scan chain tool 120 can be programmed to provide the scan chains 204 and connect and balance scan chain elements in each scan chain 204 according to the examples described herein. The scan chains 204 can include an ECO scan chain 206, a first set of scan chains 208, and a second set of scan chains 210.

The partition 200 includes a decompressor 212 for decompressing compressed data for a corresponding scan chain of the first set of scan chains 208. The partition 200 further includes a compressor 214 for compressing test data received from the corresponding scan chain of the first set of scan chains 208. A compression scan chain input 216 (e.g., an input pin) can provide the compressed data to the decompressor 212 and a compression scan chain output 218 (e.g., an output pin) can be used to receive compressed test data from the compressor 214. In further examples, as shown in FIG. 2, the partition 200 includes full scan chain inputs 220 (e.g., input pins) and serial scan chain inputs 222 (e.g., input pins). The full scan and serial chain inputs 220 and 222 can be used to provide respective full scan data and serial scan data to a corresponding multi-mode mux element of the multi-mode mux elements 224. The multi-mode mux elements 224 can be activated during a respective test mode (e.g., mode 2 or mode 3 as described herein) in response to a corresponding test mode signal 226 to provide the full scan data or the serial scan data to a respective scan chain of the second set of scan chains 210. The second set of scan chains 210 can provide respective full scan test data or serial scan test data to a corresponding output, such as one of a full scan chain output 228 and serial scan chain output 230.

Figure 3:
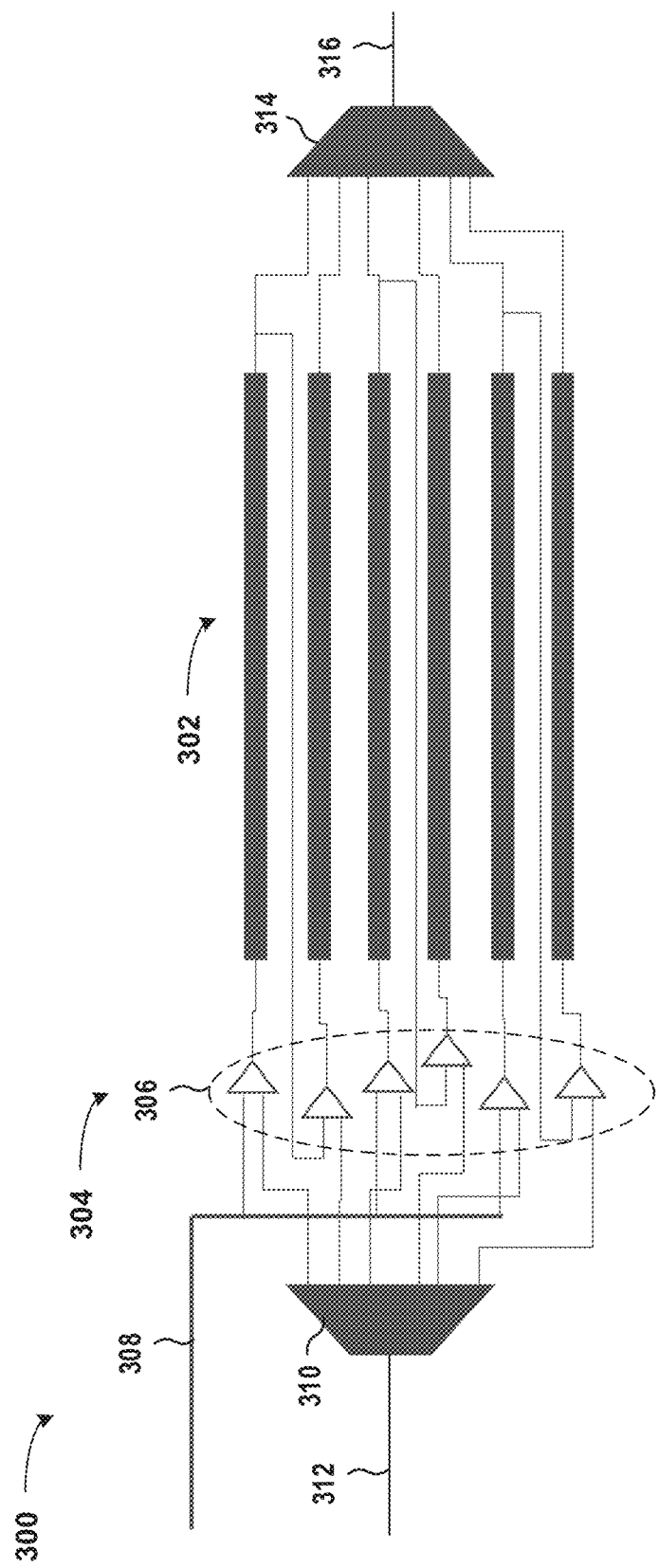
FIG. 3 illustrates another example of a partial partition of scan chain circuitry.

FIG. 3 is an example of a portion of scan chain circuitry 300, such as the scan chain circuitry 126, as shown in FIG. 1. Thus, reference can be made to the example of FIG. 1 in the example of FIG. 3. In the example of FIG. 3, the scan chain circuitry 300 includes compression chains 302 and full scan chains 304. The compression chains 302 and the full scan chains 304 can be generated or provided by the scan chain tool 120, as shown in FIG. 1. The compression and full scan chains 304 can share scan chain elements (not shown in FIG. 3) that have been allocated and balanced by the scan chain tool 120, as shown in FIG. 1. For example, a respective compression chain of the compression chains 302 can include a number of scan chain elements (not shown in FIG. 3) that can be shared and thus part of the full scan chain 304. The scan chain circuitry 300 further includes multi-mode mux elements 306. An output of each multi-mode mux element 306 can be coupled to an input of a respective compression chain of the compression chains 302. Each multi-mode mux element 306 further includes a first input and a second input. At least some of the multi-mode mux elements 306 have respective first inputs coupled to a full scan input 308 (e.g., an input pin) and the remaining multi-mode mux elements have respective second inputs coupled to an output of the respective compression chain of the compression chains 302. The full scan input 308 can receive full scan data that can be provided to the respective first inputs of a set of the multi-mode mux elements of the multi-mode mux elements 306.

As shown in the example of FIG. 3, the scan chain circuitry 300 further includes a decompressor 310 that can be coupled to a compression scan chain input 312 (e.g., an input pin) which can receive compressed data. The decompressor 310 can provide decompressed data to a respective second input of the multi-mode mux elements 306. Each multi-mode mux element of the multi-mode mux elements 306 can be activated during a test mode (e.g., mode 1 or mode 2) in response to a corresponding test mode signal (not shown in FIG. 3) to provide the compressed data or the serial scan data to a respective compression scan chain of the compression scan chains 302 or an output of corresponding compression scan chain of the compression scan chains 302. The scan chain circuitry 300 further includes a compressor 312 that can receive data from corresponding compressed scan chains 302 or the output of at least some of the multi-mode mux elements 306 during a respective test mode to provide compressed test data to a shared compression and full scan chain output 316 (e.g., an output pin).

While the example of FIG. 3 illustrates compression chains 302 in combination with the full scan chains 304 in other examples the full scan chains 304 can be omitted. In examples wherein the full scan chains 304 are omitted the multi-mode mux elements 306 and the full scan input 308 can be omitted as well and outputs of the decompressor 310 can be coupled to an input of a respective one of the full scan chains 304.

Figure 4:
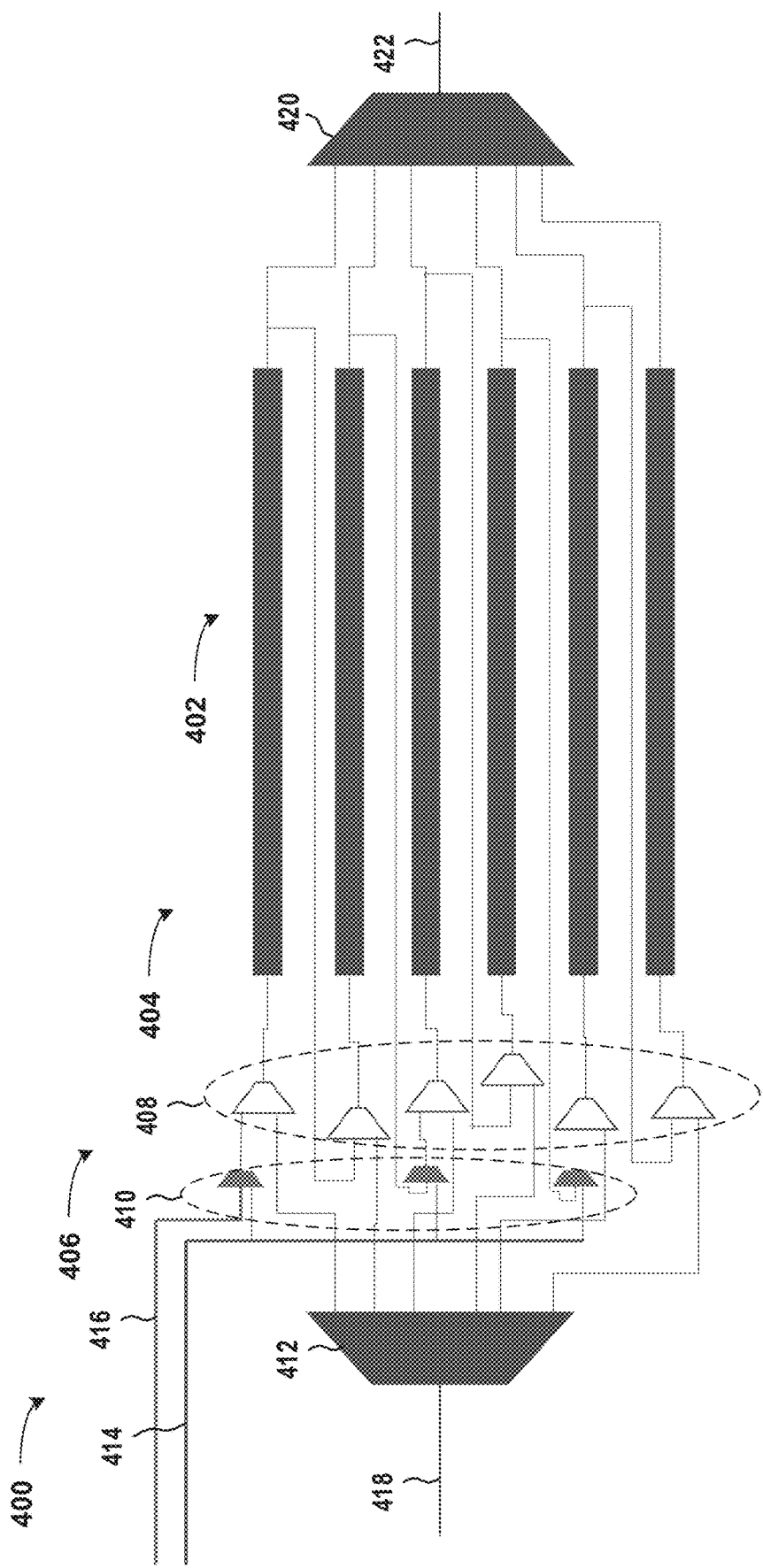
FIG. 4 illustrates a further example of a partial partition of scan chain circuitry.

FIG. 4 is an example of a portion of scan chain circuitry 400, such as the scan chain circuitry 126, as shown in FIG. 1. Thus, reference can be made to the example of FIG. 1 in the example of FIG. 4. In the example of FIG. 4, the scan chain circuitry 400 includes compression chains 402, full scan chains 404, and serial scan chains 406. The compression, full, and serial scan chains 402, 404, and/or 406 can share scan chain elements (not shown in FIG. 4) that have been allocated and balanced by the scan chain tool 120, as shown in FIG. 1. The compression, full, and serial scan chains 402, 404, and 406 can be generated or provided by the scan chain tool 120, as described herein. For example, a respective compression chain of the compression chains 402 can include a number of scan chain elements (not shown in FIG. 4) that can be shared and thus part of the full scan chain 404 and/or the serial scan chain 406.

The scan chain circuitry 400 includes a first set of multi-mode mux elements 408 and a second set of multi-mode mux elements 410. An output of each of the first set of multi-mode mux elements 408 is coupled to an input of a respective compression chain of the compression chains 402. Each multi-mode mux element of the first and second set of multi-mode mux elements 408 and 410 includes a first input and a second input. At least some of the first set of multi-mode mux elements 408 have respective first inputs coupled to a corresponding output of at least some of the second set of multi-mode mux elements 410. Each multi-mode mux element of the first set of multi-mode mux elements 408 can have respective second inputs coupled to an output of a compressor 412.

The second set of multi-mode mux elements 410 can have respective first inputs coupled to a full scan input 414 (e.g., an input pin). At least some of the second set of multi-mode mux elements 410 have respective second inputs coupled to a corresponding output of at least some of the first set of multi-mode mux elements 408. A select multi-mode mux element of the second set of multi-mode mux elements 410 has a first input coupled to a serial scan input 416 (e.g., an input pin). The full scan input 414 can receive full scan data and the serial scan input 416 can receive serial scan data during a corresponding test mode.

As shown in the example of FIG. 4, the scan chain circuitry 400 further includes a decompressor 412 that can be coupled to a compression scan chain input 418 (e.g., an input pin) which can receive compressed data. The decompressor 410 can provide decompressed data during the corresponding test mode to a respective compression chain 402. Each multi-mode mux element of the first and second sets of multi-mode mux elements 408 and 410 can be activated during a respective test mode (e.g., mode 1, mode 2, or mode 3) in response to a corresponding test mode signal (not shown in FIG. 4) to provide the compressed data, the full scan data, or the serial data to a respective compression scan chain of the compression scan chains 402 or an output of corresponding compression scan chains of the compression scan chains 402. The scan chain circuitry 400 further includes a compressor 420 that can receive data from corresponding compressed scan chains 402, the output of at least some of the multi-mode mux elements of the first set of multi-mode mux elements 408, or the output of at least some of the multi-mode mux elements of the second set of multi-mode mux elements 410 during a respective test mode to provide compressed test data to a shared compression, full scan, and serial scan chain output 422 (e.g., an output pin).

In view of the foregoing structural and functional features described above, example methods will be better appreciated with reference to FIGS. 5-28. While, for purposes of simplicity of explanation, the example methods of FIGS. 5-28 is shown and described as executing serially, it is to be understood and appreciated that the present examples are not limited by the illustrated order, as some actions could in other examples occur in different orders, multiple times and/or concurrently from that shown and described herein. Moreover, it is not necessary that all described actions be performed to implement the methods.

Figure 5:

FIGS. 5-15 show steps of a method 500 for implementing a scan chain balancing technique. The method 500 can be implemented by the scan chain tool 120, as shown in FIG. 1. Thus, reference can be made to the example of FIG. 1 in the example of FIGS. 5-15. The method 500 can begin at 502 by receiving scan chain group element data that can identify different groups for different test modes (e.g., mode 1, mode 2, and/or mode 3, such as described herein). As an example, the scan chain group element data can identify five groups (identified as "Group G1," "Group G2," "Group G3," "Group G4," "Group G5," and "Group G6" in FIG. 5). Each group can include a respective number of scan chain elements (identified as "Flops" in FIG. 5). In the example of FIG. 5, Group G1 includes 10 flops, Group G2 includes 27 flops, Group G3 includes 35 flops, Group G4 includes 15 flops, Group G5 includes 25 flops, and Group G6 includes 17 flops.

In some examples, at 502 the method 500 can include receiving a Y number of scan chains, wherein Y is an integer value greater than or equal to two (2). The number of scan chains as described herein can be provided at the input device 122, as shown in FIG. 1, as scan chain data. Thus, in some instances, the number of scan chains for the IC design 104 as shown in FIG. 1 can be user-specified. As an example, 13 scan chains are identified for the scan chain circuitry 126, as shown in FIG. 1. In the example method 500, the 13 scan chains are identified as "C1," "C2," "C3," "C4," "C5," "C6," "C7," "C8," "C9," "C10," "C11," "C12," "C13." Thus, 13 scan chains are to be used during scan chain stitching.

Figure 6:
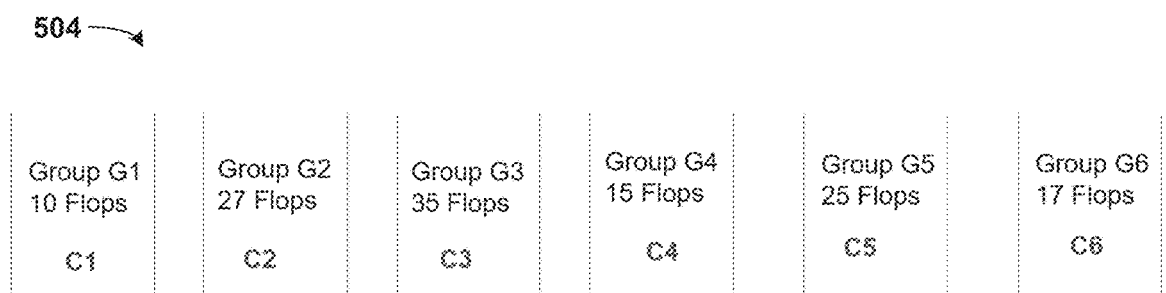
Figure 7:
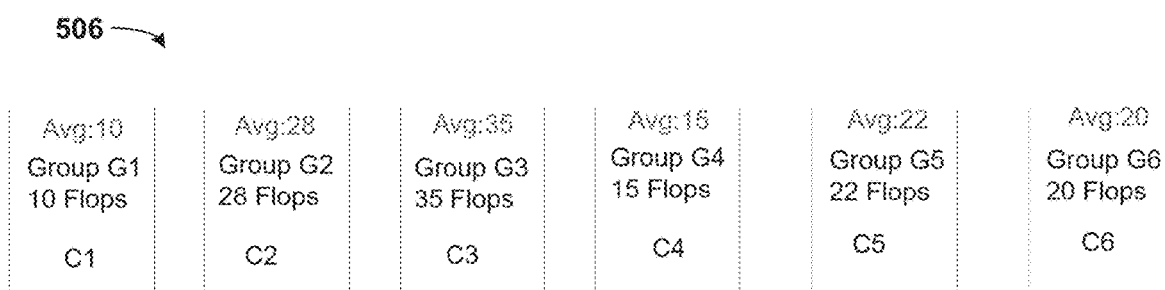

At 504, as shown in FIG. 6, the method 500 includes assigning each scan chain to one of the groups. For example, scan chain C1 is assigned to Group G1, scan chain C2 is assigned to Group G2, scan chain C3 is assigned to Group G3, scan chain C4 is assigned to Group G4, scan chain C5 is assigned to Group G5, and scan chain C6 is assigned to Group G6. At 506, as shown in FIG. 7, the method 500 includes computing an average chain length for each group. In some examples, the average chain length for each group can be computed according to equation (1): ACL=NF/NC, wherein ACL is the average chain length, NF is a number of scan chain elements in a respective group, and NC is a number of scan chains. For example, the ACL for Group G1 is 10 (e.g., 10/1=10) (identified as "Avg:10" in FIG. 7). Thus, the average chain length for Group G2 is 28 (identified as "Avg:28" in FIG. 7), the average chain length for Group G3 is 35 (identified as "Avg:35" in FIG. 7), the average chain length for Group G4 is 15 (identified as "Avg:15" in FIG. 7), the average chain length for Group G5 is 22 (identified as "Avg:22" in FIG. 7), and the average chain length for Group G6 is 20 (identified as "Avg:20" in FIG. 7).

At 508, as shown in FIG. 8, the method 500 includes assigning a next scan chain from the remaining scan chains (e.g., scan chains C7, C8, C9, C10, C11, C12, and C13) to a given group of the Groups G1-G6 with a maximum average chain length. In the example method 500, Group G3 is identified as having a greatest average scan chain among the Groups G1-G6, and the next scan chain C7 is allocated or assigned to the Group G3. In some examples, at 508 the method 500 includes computing an updated average chain length for the given group of the Groups G1-G6. The updated average chain length for the given group can be computed according to equation (1) above. Thus, as shown in FIG. 9, the Group G3 has a new average chain length of 17.5 (identified as "Avg:17.5" in FIG. 9).

At 510, as shown in FIG. 9, the method 500 includes assigning the next scan chain from the remaining scan chains (e.g., scan chains C8, C9, C10, C11, C12, and C13) to a given group of the Groups G1-G6 with a maximum average chain length. In the example method 500, Group G2 is identified as having a greatest average scan chain among the Groups G1-G6, and the next scan chain C8 is allocated or assigned to the Group G2. In some examples, at 510 the method 500 includes computing an updated average chain length for the given group of the Groups G1-G6. The updated average chain length for the given Group can be computed according to equation (1) above. Thus, as shown in FIG. 10, the Group G2 has a new average chain length of 14 (identified as "Avg:14" in FIG. 10).

At 512, as shown in FIG. 10, the method 500 includes assigning the next scan chain from the remaining scan chains (e.g., scan chains C9, C10, C11, C12, and C13) to a given group of the Groups G1-G6 with a maximum average chain length. In the example method 500, Group G5 is identified as having a greatest average scan chain among the Groups G1-G6, and the next scan chain C9 is allocated or assigned to the Group G5. In some examples, at 512 the method 500 includes computing an updated average chain length for the given group of the Groups G1-G6. The updated average chain length for the given Group can be computed according to equation (1) above. Thus, as shown in FIG. 11, the Group G5 has a new average chain length of 11 (identified as "Avg:11" in FIG. 11).

At 514, as shown in FIG. 11, the method 500 includes assigning the next scan chain from the remaining scan chains (e.g., scan chains C10, C11, C12, and C13) to a given group of the Groups G1-G6 with a maximum average chain length. In the example method 500, Group G6 is identified as having a greatest average scan chain among the Groups G1-G6, and the next scan chain C10 is allocated or assigned to the Group G6. In some examples, at 514 the method 500 includes computing an updated average chain length for the given group of the Groups G1-G6. The updated average chain length for the given group can be computed according to equation (1) above. Thus, as shown in FIG. 12, the Group G6 has a new average chain length of 10 (identified as "Avg:10" in FIG. 12).

At 516, as shown in FIG. 12, the method 500 includes assigning the next scan chain from the remaining scan chains (e.g., scan chains C11, C12, and C13) to a given group of the Groups G1-G6 with a maximum average chain length. In the example method 500, Group G3 is identified as having a greatest average scan chain among the Groups G1-G6, and the next scan chain C11 is allocated or assigned to the Group G6. In some examples, at 516 the method 500 includes computing an updated average chain length for the given group of the Groups G1-G6. The updated average chain length for the given group can be computed according to equation (1) above. Thus, as shown in FIG. 13, the Group G3 has a new average chain length of 11.6 (identified as "Avg:11.6" in FIG. 13).

At 518, as shown in FIG. 13, the method 500 includes assigning the next scan chain from the remaining scan chains (e.g., scan chains C12 and C13) to a given group of the Groups G1-G6 with a maximum average chain length. In the example method 500, Group G4 is identified as having a greatest average scan chain among the Groups G1-G6, and the next scan chain C12 is allocated or assigned to the Group G4. In some examples, at 518 the method 500 includes computing an updated average chain length for the given group of the Groups G1-G6. The updated average chain length for the given group can be computed according to equation (1) described above. Thus, as shown in FIG. 14, the Group G4 has a new average chain length of 7.5 (identified as "Avg:7.5" in FIG. 14).

At 520, as shown in FIG. 14, the method 500 includes assigning the next scan chain from the remaining scan chains (e.g., scan chain C13) to a given group of the Groups G1-G6 with a maximum average chain length. In the example method 500, Group G2 is identified as having a greatest average scan chain among the Groups G1-G6, and the next scan chain C13 is allocated or assigned to the Group G2. In some examples, at 518 the method 500 includes computing an updated average chain length for the given group of the Groups G1-G6. The updated average chain length for the given Group can be computed according to equation (1) above. Thus, as shown in FIG. 15, the Group G2 has a new average chain length of 9.3 (identified as "Avg:9.3" in FIG. 15). Thus, at step 520 all scan chains identified based on the user input have been assigned or allocated to a respective Group of the Groups G1-G6 and final average chain lengths are identified for each group of the Groups G1-G6, as shown in FIG. 15.

In some examples, at 522, as shown in FIG. 15, the method 500 includes balancing scan chain elements of each group across assigned scan chains. For example, at 522, scan chain elements of each group can be assigned to respective scan chains in a round-robin order (e.g., circular order), or until each scan chain element of a respective group has been assigned to an associated scan chain for the respective group. By way of further example, for Group G2, scan chain element 1 is assigned to scan chain C2, scan chain element 2 is assigned to scan chain C8, scan chain element 3 is assigned to scan chain C13, scan chain element 4 is assigned to scan chain C2, scan chain element 5 is assigned to scan chain C8, scan chain element 6 is assigned to scan chain C6, and so forth until a last or remaining scan chain element 28 has been assigned to C2. Thus, for each of the Groups G1-G6, at 522, scan chain elements can be assigned, and a number of scan chain elements assigned to the respective group of the associated scan chain are identified in FIG. 15 with curly brackets. Continuing with the example of FIG. 15, the number of scan chain elements assigned to the scan chain C2 is 10 (identified as "(10)" in the example of FIG. 15), the number of scan chain elements assigned to the scan chain C8 is 9, and the number of scan chain elements assigned to the scan chain C13 is 9. Moreover, as shown in FIG. 15, because Group G1 is assigned a single scan chain C1, all scan chain elements of Group G1 are assigned to the scan chain C1.

FIGS. 16-21 show steps of an example of a method 1600 for multi-mode scan connection or stitching. The method 1600 can be implemented by the scan chain tool 120, as shown in FIG. 1. Thus, reference can be made to the example of FIG. 1 in the example of FIGS. 16-21. In the example of the method 1600, mode 1 can correspond to a production test mode (or compression mode) and a mode 2 can correspond to a debug mode (or full scan mode).

Figure 16:
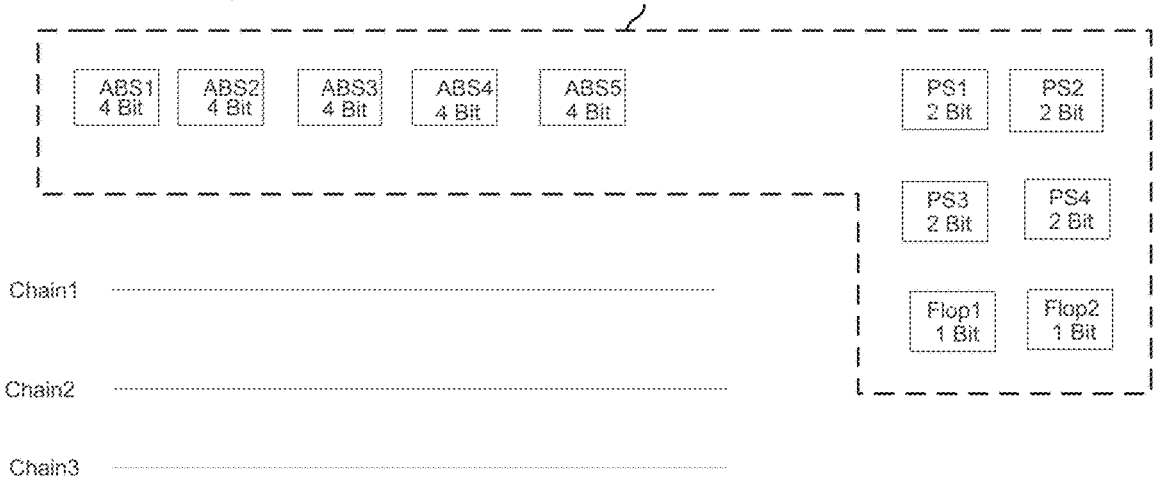
FIGS. 16-21 is an example of a method for multi-mode scan chain stitching.

The method 1600 can begin at 1602 by identifying or retrieving (e.g., from memory, such as the memory 108, as shown in FIG. 1) data identifying scan chain elements 1604 that are be used during the mode 1 for the compression chains. In some examples, the scan chain elements 1604 that are used during the mode 1 for the compression chains can be used during the mode 2 for a full scan chain and thus can be shared among chains during different test modes. In the example of FIG. 16, scan chain elements of different types or lengths are identified or retrieved at 1602. The scan chain elements 1604 include five scan chain elements (labeled as "ABS1 4 Bit," "ABS2 4 Bit," "ABS3 4 Bit," "ABS4 4 Bit," and "ABS5 4 Bit") that are four (4) flip flops in length. The use of the term "Bit" with respect to the example of the method 1600 indicates a length of the scan chain element and thus a number of clock cycles for shifting data. Thus, the scan chain element ABS1 in the example of the method 1600 includes four (4) flip flops and thus uses four (4) clock cycles to shift data from an input to the scan chain element ABS1 to an output of the scan chain element ABS2.

By way of further example, the scan chain elements 1604 include two (2) scan chain elements (labeled as "Flop1 1 Bit," and "Flop2 1 Bit") that are one (1) flip flop in length and four (4) scan chain elements (labeled as "PS1 2 Bit," "PS2 2 Bit," "PS3 2 Bit," and "PS4 2 Bit") that are two (2) flip flops in length). For example, the scan chain element PS1 in the example of the method 1600 includes two (2) flip flops and thus uses two (2) clock cycles to shift data from an input to the scan chain element PS1 to an output of the scan chain element PS1. By way of further example, the scan chain element Flop1 in the example of the method 1600 includes one (1) flip flop and thus uses one (1) clock cycle to shift data from an input to the scan chain element Flop1 to an output of the scan chain element Flop2.

In some examples, at 1602, the method 1600 can include identifying scan chains for assignment of the scan chain elements 1604 to corresponding scan chains. One or more scan chains can define or be part of a mode (e.g., that a user can implement as part of the scan chain circuitry 126, as shown in FIG. 1). In the method 1600, as an example, for clarity and brevity purposes, three (3) scan chains are shown (labeled as "Chain1," "Chain2," and "Chain3"). In other examples, more than three (3) scan chain can be used for a test mode. As an example, the scan chains Chain1, Chain2, and Chain3 can be used during the compression test mode.

Figure 17:
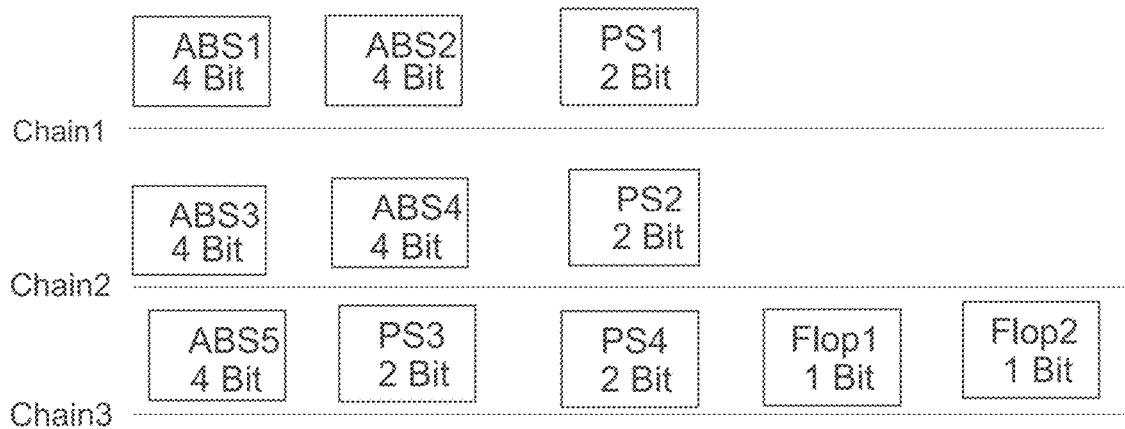

At 1606, as shown in FIG. 17, the method 1600 includes assigning or allocating the scan chain elements 1602 to respective scan chains of the scan chains Chain1, Chain2, and Chain3. The assignment of the scan chain elements 1602 to the respective scan chains of the scan chains Chain1, Chain2, and Chain3 can include implementing a scan chain configuration and balancing technique, as described herein. Thus, in some examples, the scan chain elements 1602 can be balanced across the scan chains Chain1, Chain2, and Chain3 using a method similar to the method 500, as described herein. As shown in the example of the method 1600, the scan chain balancing results in the scan chain Chain1 being ten (10) flip flops in length, the scan chain Chain2 being ten (10) flip flops in length, and the scan chain Chain3 being ten (10) flip flop in length. As such, each of the chains Chain1, Chain2, and Chain3 is ten (10) clock cycles long and thus uses ten (10) clock cycles to shift data from an input to a respective scan chain to an output of the respective scan chain.

Figure 18:
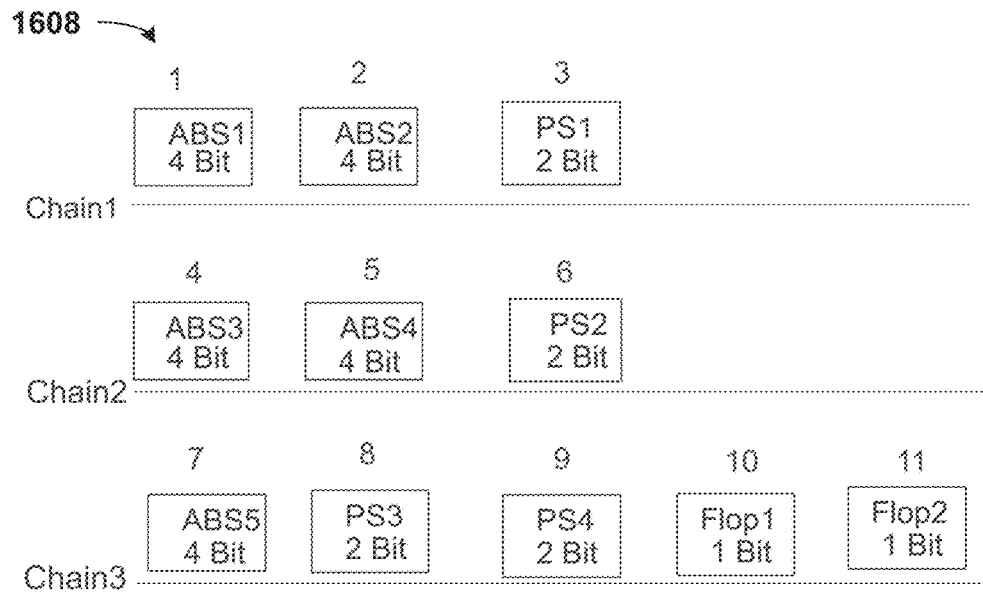

At 1608, as shown in FIG. 18, the method 1600 includes indexing the scan chain elements in response to assigning each scan chain element of the scan chain elements 1602 to the respective scan chain of the scan chains Chain1, Chain2, and Chain3. In the method 1600, the scan chain elements ABS1, ABS2, and PS1 of the scan chain Chain1 are assigned a respective first, second, and third index value, the scan chain elements ABS3, ABS4, and PS2 of the scan chain Chain2 are assigned a respective fourth, fifth, and sixth index value, and the scan chain elements ABS5, PS3, PS4, Flop1, and Flop2 of the scan chain Chain3 are assigned a respective seventh, eighth, ninth, tenth, and eleventh index value, as shown in FIG. 18.

Figure 19:
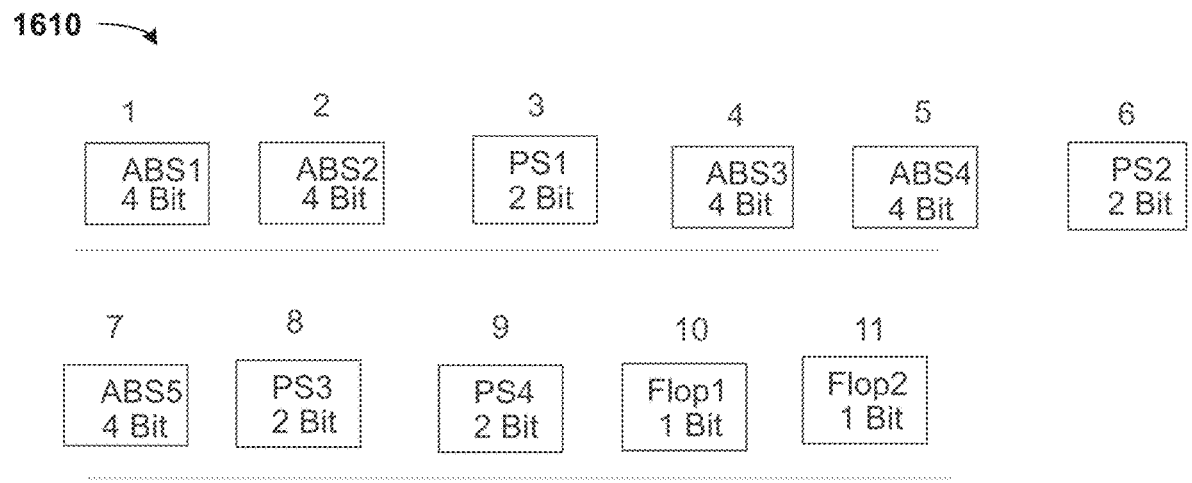

At 1610, as shown in FIG. 19, the method 1600 includes sorting the scan chain elements for implementing the compression chains based on a respective assigned index value. In some examples, at 1610, similar index scan chain elements can be sorted based on a length, clock and/or hierarchy. Thus, at higher level test modes, such as the mode 2, the method 1600 can reuse scan chain elements from a lower-level test mode, such as the mode 1.

Figure 20:
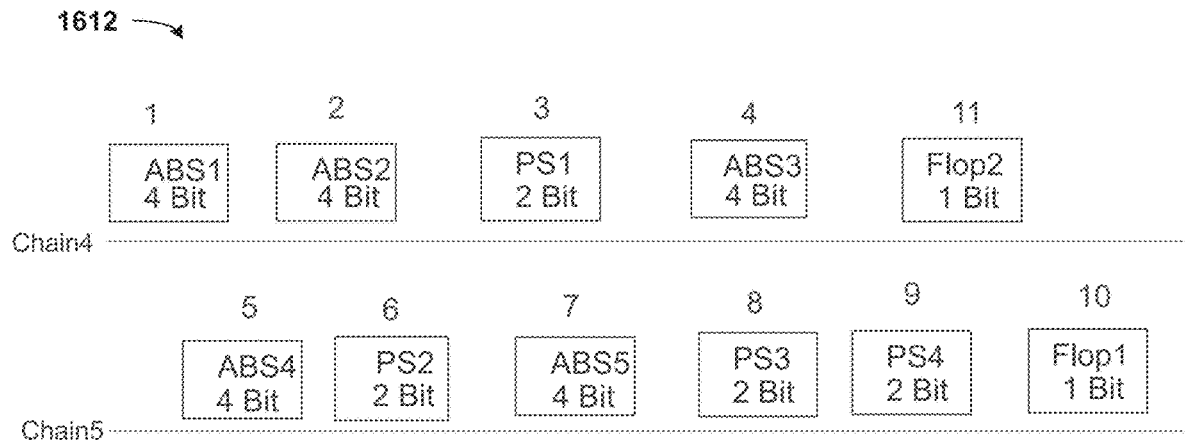

At 1612, as shown in FIG. 20, the method 1600 includes scan chain configuring and balancing the identified scan chains for the higher-level test mode (e.g., the mode 2). In the method 1600, the higher-level test mode includes two (2) scan chains, which are identified as "Chain4" and "Chain5" in FIG. 20. However, in other examples, more than two (2) scan chains can be used for full scan chain implementation.

In some examples, at 1612, scan chain configuring and balancing can be implemented across the scan chains Chain4 and Chain5 using a method similar to the method 500, as described herein. As shown in the example of the method 1600, the scan chain balancing results in the scan chain Chain4 being fifteen (15) flip flops in length, and the scan chain Chain5 being fifteen (15) flip flops in length. As such, each of the chains Chain4 and Chain5 is fifteen (15) clock cycles long and thus uses fifteen (15) clock cycles to shift data from an input to a respective scan chain to an output of the respective scan chain.

Figure 21:
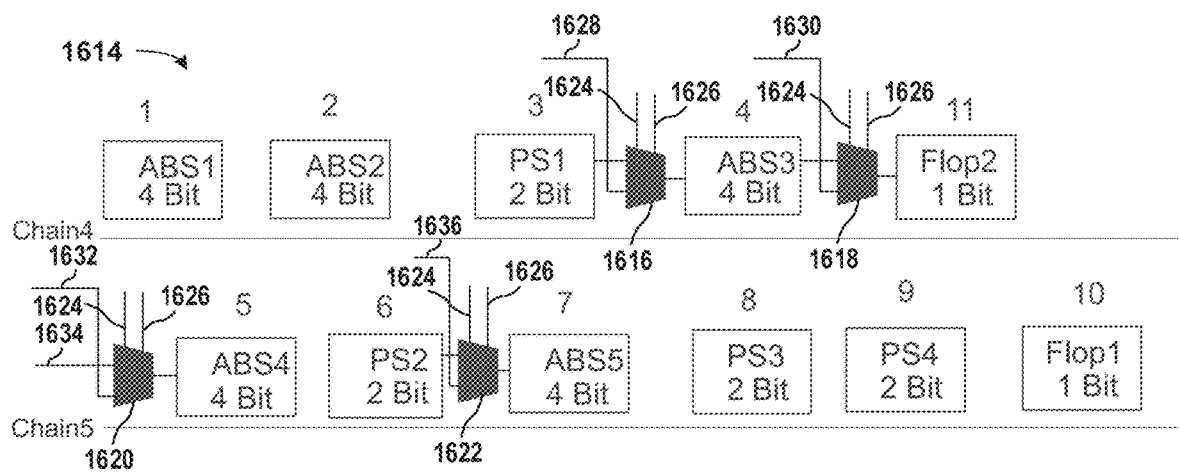

At 1614, as shown in FIG. 21, the method 1600 includes allocating multi-mode mux elements 1616, 1618, 1620, and 1622 in response to the scan chain balancing. The allocation of the multi-mode mux elements 1616, 1618, 1620, and 1622 can be such that a lower number of multi-mode mux elements is used, which improves a connectivity of scan chain elements. Thus, an overhead of the scan chain circuitry 126 can be reduced (or lowered) in contrast to existing approaches for allocating multi-mode mux elements. Existing approaches for multi-mode mux element allocation use scan chain circuit element sorting techniques for allocation that result in a higher number of multi-mode mux elements for a scan chain circuit design. According to the examples herein, a reduced number of multi-mode mux elements are used for the scan chain circuit design based on the assigned index values.

For example, at 1614, the multi-mode mux element 1616 is inserted between the scan chain elements PS1 and ABS3 to enable the use of the scan chain element ABS3 during one of the modes 1 or 2 based on a respective test mode signal received at the multi-mode mux element 1616. The multi-mode mux element 1616 during the mode 1 can be enabled in response to receiving a first test mode signal 1624 such that data can be provided from a scan input 1628 of the scan chain Chain2 to the scan chain element ABS3. In other examples, the multi-mode mux element 1616 during the mode 2 can be enabled in response to receiving a second test mode signal 1626 such that data can be provided from an output of the scan chain element PS1 to an input of the scan chain element ABS3.

By way of further example, at 1614, the multi-mode mux element 1618 is inserted between the scan chain elements ABS3 and Flop2 to enable the use of the scan chain element Flop2 during one of the modes 1 or 2 based on the respective test mode signal received at the multi-mode mux element 1618. The multi-mode mux element 1618 during the mode 1 can be enabled in response to receiving the first test mode signal 1624 such that data can be provided from an output 1630 of the scan chain element Flop1 to an input of the scan chain element Flop2. In other examples, the multi-mode mux element 1618 during the mode 2 can be enabled in response to receiving the second test mode signal 1626 such that data can be provided from an output of the scan chain element ABS3 to the input of the scan chain element Flop2.

By way of further example, at 1614, the multi-mode mux element 1620 is inserted before the scan chain elements ABS4 to enable the use of the scan chain element Flop2 during one of the modes 1 or 2 based on the respective test mode signal received at the multi-mode mux element 1620. The multi-mode mux element 1620 during the mode 1 can be enabled in response to receiving the first test mode signal 1624 such that data can be provided from an output 1632 of the scan chain element ABS3 to an input of the scan chain element ABS4. In other examples, the multi-mode mux element 1620 during the mode 2 can be enabled in response to receiving the second test mode signal 1626 such that data can be provided from a scan input 1634 of the scan chain Chain5 to the input of the scan chain element ABS4.

By way of further example, at 1614, the multi-mode mux element 1622 is inserted between the scan chain elements PS2 and ABS5 to enable the use of the scan chain element ABS5 during one of the modes 1 or 2 based on the respective test mode signal received at the multi-mode mux element 1622. The multi-mode mux element 1622 during the mode 1 can be enabled in response to receiving the first test mode signal 1624 such that data can be provided from a scan input 1636 of the scan chain Chain3 to an input of the scan chain element ABS5. In other examples, the multi-mode mux element 1622 during the mode 2 can be enabled in response to receiving the second test mode signal 1626 such that data can be provided from an output of the scan chain element PS2 to the input of the scan chain element ABS5.

Accordingly, multi-mode mux elements can be inserted in a more effective manner such that an overhead cost of the scan chain circuitry 126 can be reduced in contrast to existing approaches to enable different inputs for different test modes as test modes can have different scan-in and scan-out pins. Additionally, scan chain elements can be shared among the different test modes using the inserted multi-mux elements.

Figure 22:
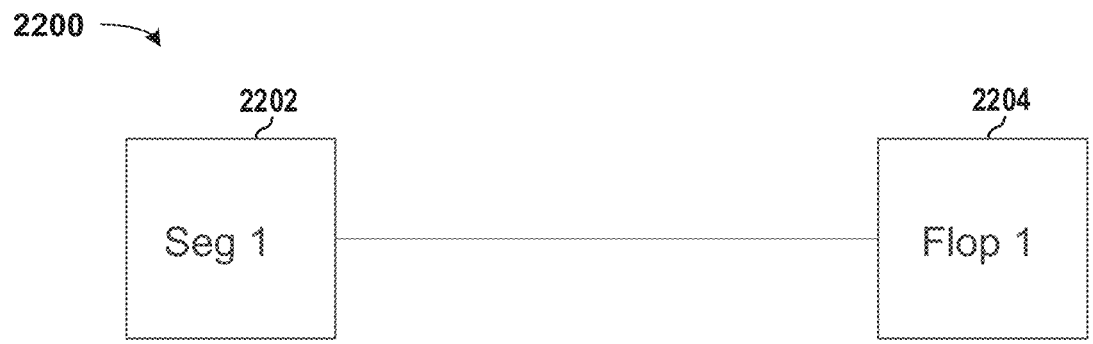
FIG. 22 is an example of a partial compression scan chain.

FIG. 22 is an example of a partial compression scan chain 2200, such as a respective compression scan chain of the scan chain circuitry 126, as shown in FIG. 1. Thus, reference can be made to the example of FIG. 1 in the example of FIG. 22. The partial compression scan chain 2200 can include a scan chain element 2202 (labeled as "Seg 1" in FIG. 22) and a scan chain element 2202 (labeled as "Flop 1" in FIG. 22). The partial compression scan chain 2200 during mode 1 can be configured to provide data from an output of the scan chain element 2202 to an input of the scan chain element 2204.

Figure 23:
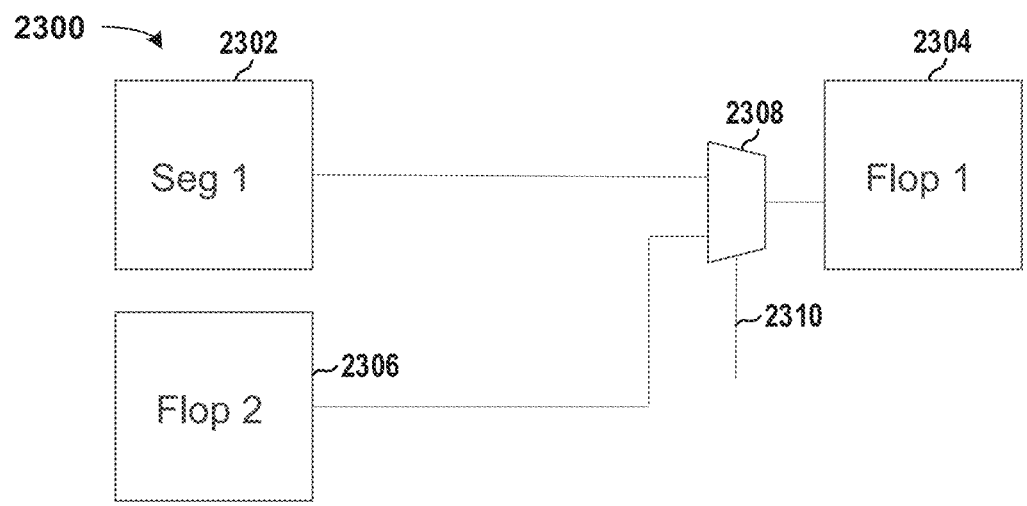
FIG. 23 is another example of a partial compression scan chain.

FIG. 23 is an example of a partial compression scan chain 2300, such as a respective compression scan chain of the scan chain circuitry 126, as shown in FIG. 1. Thus, reference can be made to the example of FIG. 1 in the example of FIG. 23. The partial compression scan chain 2300 can include a scan chain element 2302 (labeled as "Seg 1" in FIG. 23), a scan chain element 2304 (labeled as "Flop 1" in FIG. 23), and a scan chain element 2306 (labeled as "Flop 2" in FIG. 23). The partial compression scan chain 2300 can further include a multi-mode mux element 2308. In some examples, the multi-mode mux element 2308 during mode 2 can be enabled in response to receiving a test mode signal 2310 to provide data from an output of the scan chain element 2306 to an input of the scan chain element 2304. In other examples, the multi-mode mux element 2308 during mode 1 (e.g., a lower test mode than mode 2) can be enabled in response to receiving another test mode signal (not shown in FIG. 23) to provide data from an output of the scan chain element 2302 to an input of the scan chain element 2304.

Figure 24:
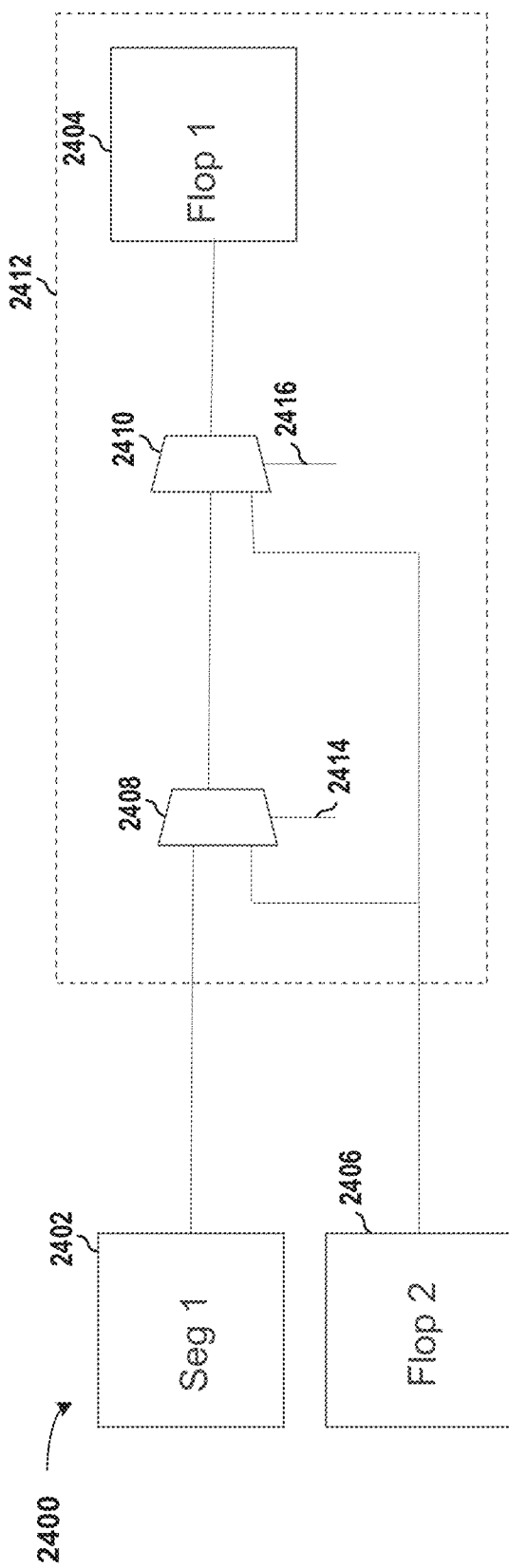
FIG. 24 is a further example of a partial compression scan chain.

FIG. 24 is an example of a partial compression scan chain 2400, such as a respective serial scan chain of the scan chain circuitry 126, as shown in FIG. 1. Thus, reference can be made to the example of FIG. 1 in the example of FIG. 24. The partial compression scan chain 2400 can include a scan chain element 2402 (labeled as "Seg 1" in FIG. 24), a scan chain element 2404 (labeled as "Flop 1" in FIG. 24), and a scan chain element 2406 (labeled as "Flop 2" in FIG. 24). The partial compression scan chain 2400 can further include multi-mode mux elements 2408 and 2410. In some examples, the scan chain element 2404 and the multimode mux elements 2408 and 2410 can be part of a shared wrapper 2412.

In some examples, the multi-mode mux element 2408 during mode 2 can be enabled in response to receiving a test mode signal 2414 to provide data from an output of the scan chain element 2406 to an input of the multi-mode mux element 2410. The multi-mode mux element 2410 can provide the data to an input of the scan chain element 2404 in response to receiving the test mode signal 2414 (not shown in FIG. 24). In other examples, the multi-mode mux element 2308 during mode 3 can be enabled in response to receiving a test mode signal 2416 to provide data from an output of the scan chain element 2406 to an input of the scan chain element 2404. In the example of FIG. 24, a path from the scan chain element 2406 to the scan chain element 2404 can have a respective multi-mode mux element for each subsequent mode which may employ a connection between the scan chain element 2404 and 2406. Thus, each scan chain element pair may have a max of R−1 multi-mode mux elements, wherein R is a mode number, such as mode 1, mode 2, and mode 3 described herein. A wrapper cell such as the wrapper cell 2412 can have a max of R−1 multi-mode mux elements. For example, two (2) multi-mode mux elements are used to connect the scan chain elements 2404 and 2406.

Figure 25:
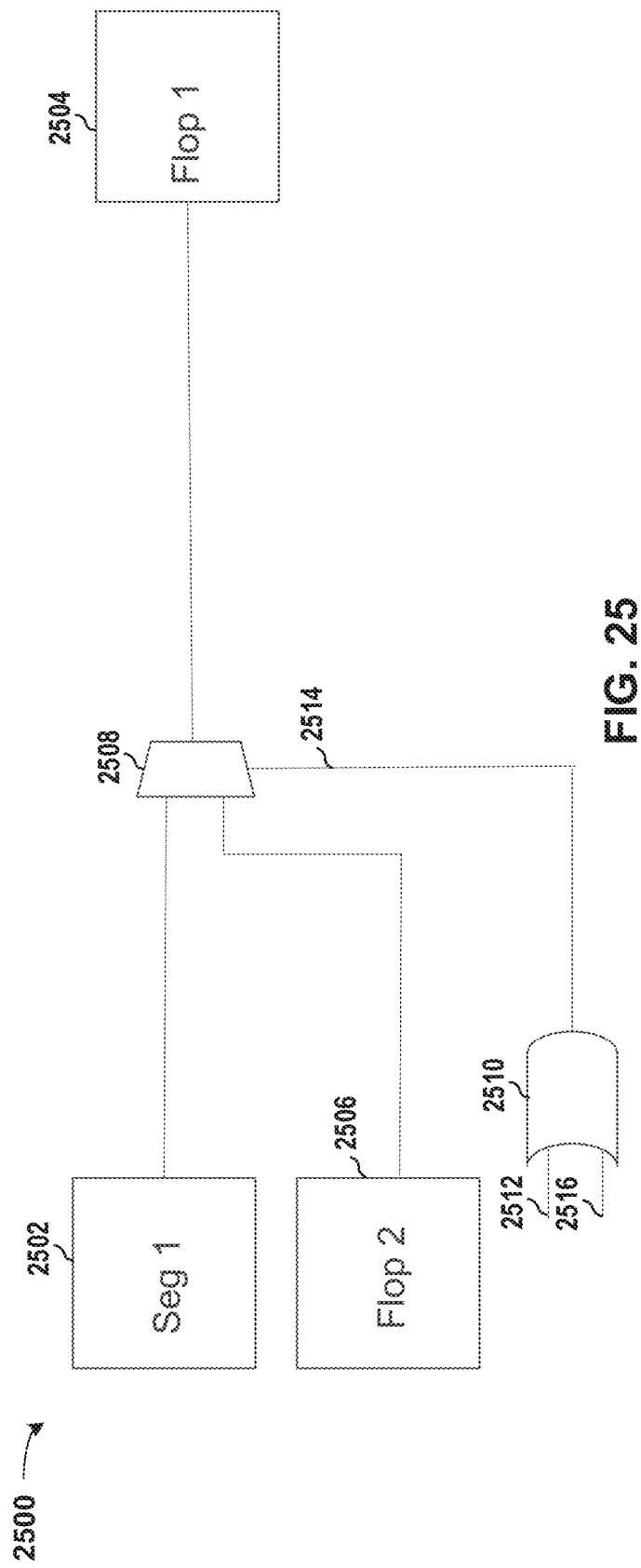
FIG. 25 is yet another example of a partial compression scan chain.

FIG. 25 is an example of a partial compression scan chain 2500, such as a respective serial scan chain of the scan chain circuitry 126, as shown in FIG. 1. Thus, reference can be made to the example of FIG. 1 in the example of FIG. 25. The partial compression scan chain 2500 can include a scan chain element 2502 (labeled as "Seg 1" in FIG. 25), a scan chain element 2504 (labeled as "Flop 1" in FIG. 25), and a scan chain element 2506 (labeled as "Flop 2" in FIG. 25). The partial compression scan chain 2500 can further include a multi-mode mux element 2508 and an OR gate element 2510.

In some examples, the multi-mode mux element 2508 during mode 2 can be enabled in response to receiving a test mode signal 2512 to provide data from an output of the scan chain element 2506 to an input of the scan chain element 2504. During the mode 2, the OR gate element 2510 can provide an enable signal 2514 to provide a connection path between the scan chain element 2406 and the scan chain element 2504. In some examples, the multi-mode mux element 2508 during mode 3 can be enabled in response to receiving a test mode signal 2516 to provide data from an output of the scan chain element 2506 to the input of the scan chain element 2504. During the mode 3, the OR gate element 2510 can provide the enable signal 2514 to provide the connection path between the scan chain element 2406 and the scan chain element 2504.

In some examples, a scan chain tool such as the scan chain tool 120 as shown in FIG. 1 can be programmed to merge the multi-mode mux elements 2408 and 2410 as shown in FIG. 24 into a single multi-mode mux element 2508 and insert the multi-mode mux element 2508 into the scan chain circuitry 126 with the OR gate element 2510 to provide the partial compression scan chain 2500, as shown in FIG. 25. The scan chain tool 120 can be programmed to merge the multi-mode mux elements 2408 and 2410 by deleting one of the multi-mode mux elements 2408 and 2410 such that a remaining multi-mode mux element corresponds to the multi-mode mux element 2508, as shown in FIG. 25. The scan chain tool 120 can be programmed in some instances to implement the merging of multi-mode mux elements and inserting of the OR gate element into the scan chain circuitry 126 as a post-processing step to a multi-mode scan connection method, such as described herein (e.g., with respect to FIGS. 16-21).

Figure 26:
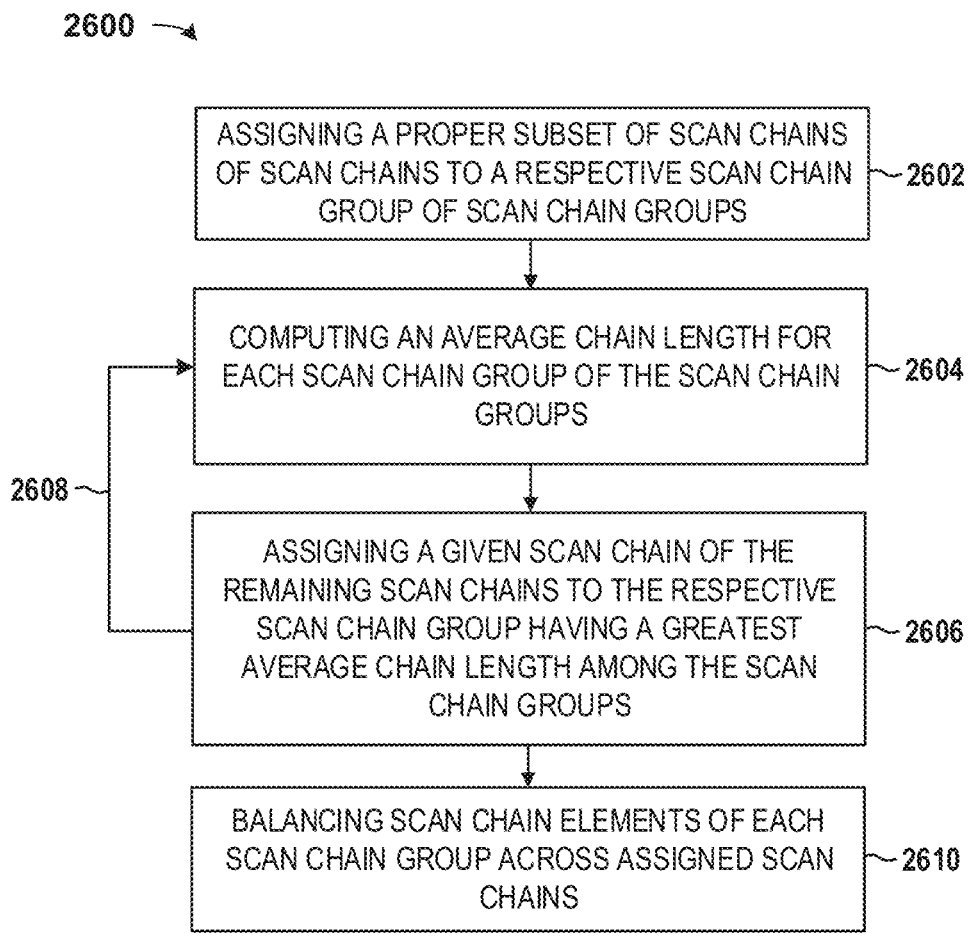
FIG. 26 is an example of a method for scan chain balancing scan chain groups across scan chains.

FIG. 26 is an example of a method 2600 for scan chain balancing a number of scan chains across a number of scan chain groups for implementing scan chain circuitry for an IC design, such as the scan chain circuitry 126 of the IC design 104, as shown in FIG. 1. Thus, reference can be made to the example of FIG. 1 in the example of FIG. 24. The method 2600 can be implemented by the scan chain tool 120, as shown in FIG. 1. The method 2400 can begin at 2602 by assigning a proper subset of scan chains of the scan chains to a respective scan chain group of scan chain groups. For example, a respective scan chain of the scan chains can be assigned to a given scan chain group. At 2602, computing an average chain length for each scan chain group of the scan chain groups. The average chain length can be computed according to equation (1) above.

At 2606, assigning a given scan chain of the remaining scan chains to the respective scan chain group having a greatest average chain length among the scan chain groups. At 2608, the steps 2604-2606 can be repeated until all remaining scan chains have been assigned to one of the scan chain groups. In some examples, the method 2600 includes at 2610, balancing scan chain elements assigned to each group across assigned scan chains. For example, scan chain elements of each scan chain group can be assigned to associated scan chain elements in a round-robin order (e.g., circular order) or until each scan chain element of a respective group has been assigned to an associated scan chain for the respective group. In some examples, if a single scan chain has been assigned to the respective scan chain group, all scan chain elements of the respective scan chain group can be assigned to that scan chain.

Figure 27:
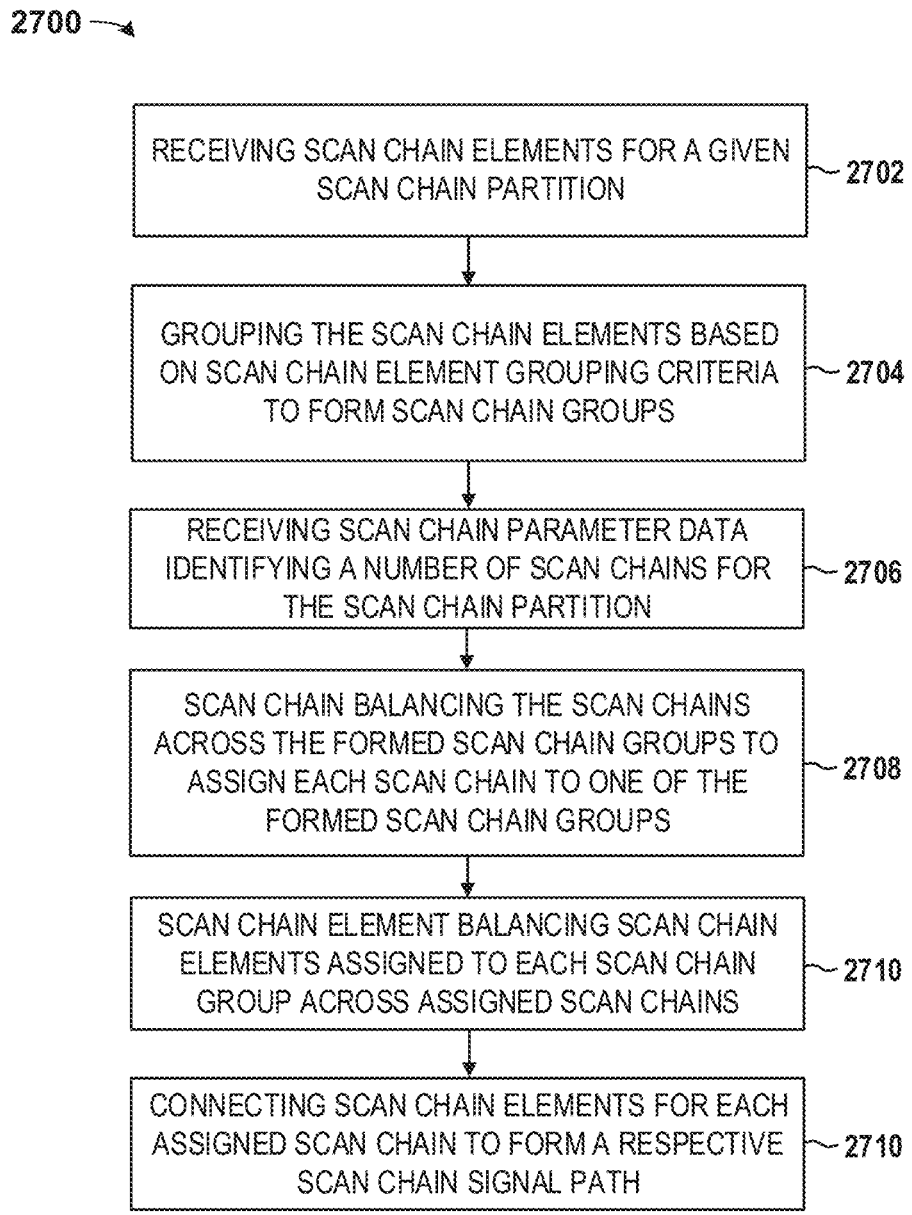
FIG. 27 is an example of a method for scan chain elements configuration for different test modes.

FIG. 27 is an example of a method 2700 for scan chain elements configuration for different test modes for implementing scan chain circuitry for an IC design, such as the scan chain circuitry 126 of the IC design 104, as shown in FIG. 1. Thus, reference can be made to the example of FIG. 1 in the example of FIG. 27. The method 2700 can be implemented by the scan chain tool 120, as shown in FIG. 1. The method 2700 can begin at 2702 by receiving scan chain elements for a given scan chain partition that is to be implemented as part of the scan chain circuitry. At 2704, grouping the scan chain elements for each scan chain partition based on scan chain element grouping criteria to form scan chain groups. At 2706, receiving scan chain data identifying a number of scan chains for the given scan chain partition.

At 2708, scan chain balancing the scan chains across the formed scan chain groups to assign each scan chain to one of the formed scan chain groups. In some examples, the scan chain balancing can include the method 2600, as shown in FIG. 26. Thus, in some instances, the method 2600 can be implemented at step 2708 of the method 2700. At 2710, scan chain element balancing scan chain elements assigned to each scan chain group across assigned scan chains. At 2712, connecting scan chain elements for each assigned scan chain to form a scan chain signal path of the given scan chain partition in response to the scan chain element balancing.

Figure 28:
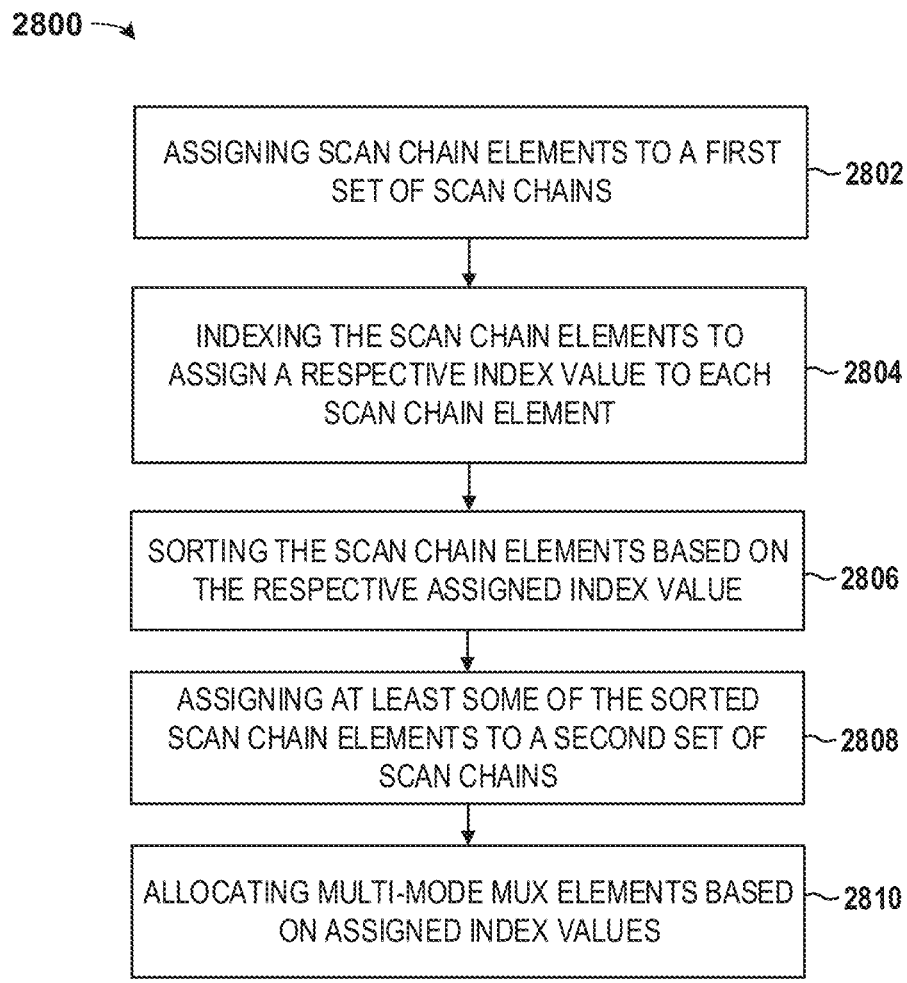
FIG. 28 is an example of a method for scan chain connection for different test modes.

FIG. 28 is an example of a method 2800 for scan chain connection between different test modes for implementing scan chain circuitry for an IC design, such as the scan chain circuitry 126 of the IC design 104, as shown in FIG. 1. Thus, reference can be made to the example of FIG. 1 in the example of FIG. 28. The method 2800 can be implemented by the scan chain tool 120, as shown in FIG. 1. At 2802, the method 2800 includes assigning scan chain elements to a first set of scan chains. The assigning of the scan chain elements to the first set of scan chains can include implementing a scan chain configuration and balancing technique, as described herein. At 2804, indexing the scan chain elements to assign to each scan chain element a respective index value in response to assigning each scan chain element of the scan chain elements to a respective scan chain of the first set of scan chains. At 2806, sorting the scan chain elements based on the respective assigned index value. At 2808, assigning at least some of the sorted scan chain elements to a second set of scan chains different from the first set of scan chains based on the assigned index value. The assigning of the at least some of the sorted scan chain elements to the second set of scan chains can include implementing a scan chain configuration and balancing technique, as described herein. At 2810, inserting multi-mode mux elements into the second set of scan chains to allow for multi-mode scan chain connection between the first and second set of scan chains (e.g., during different modes, such as mode 0 and mode 1 as described herein).

Figure 29:
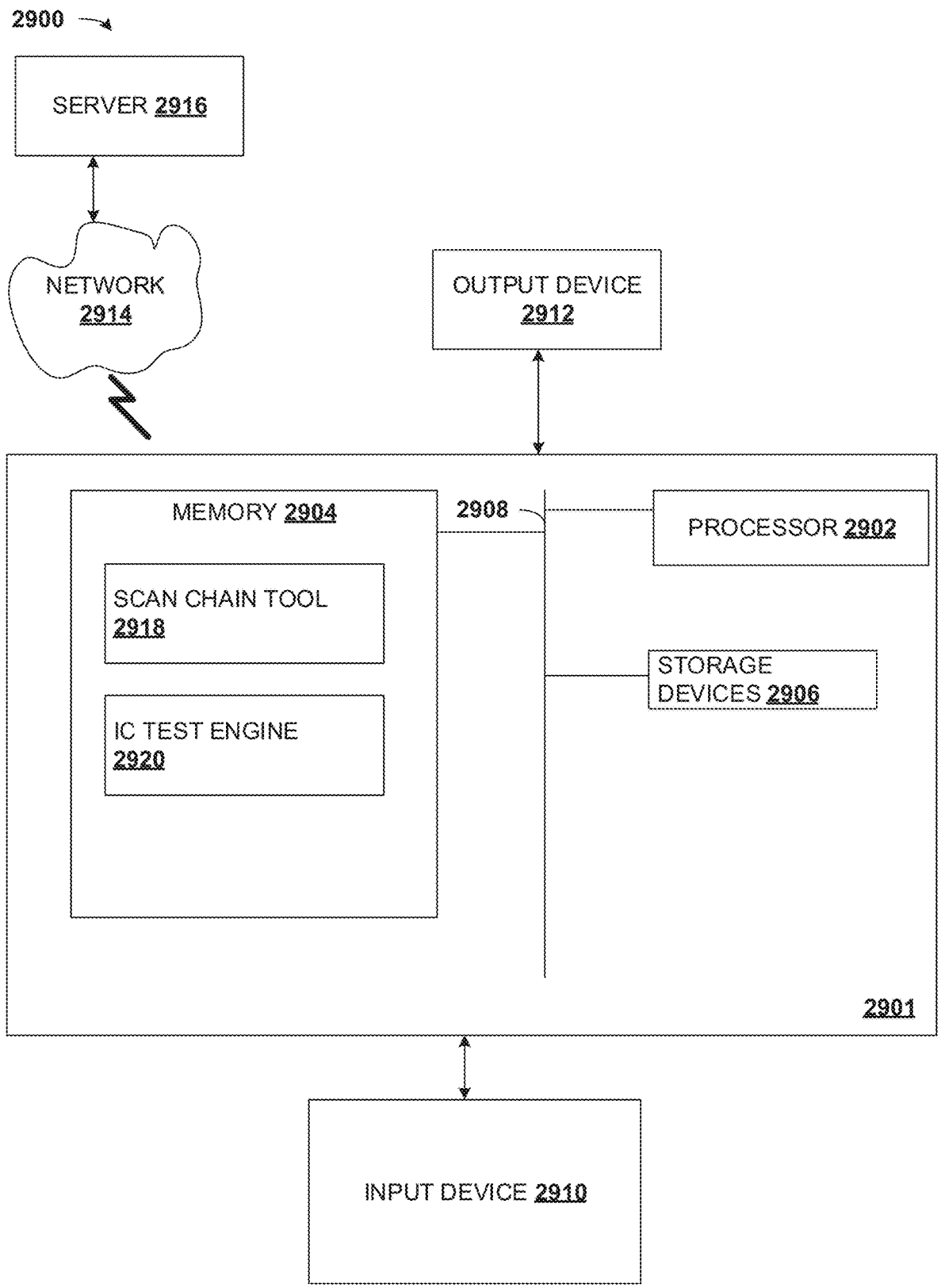
FIG. 29 illustrates an example of a computing system employable to execute scan chain stitching.

The examples herein may be implemented on virtually any type of computing system regardless of the platform being used. For example, a computing system 2900 may be one or more mobile devices (e.g., laptop computer, smart phone, personal digital assistant, tablet computer, or other mobile device), desktop computers, servers, blades in a server chassis, or any other type of computing device or devices that include at least the minimum processing power, memory and input and output device(s) to perform one or more embodiments. As shown in FIG. 29, the computing system 2900 can include a computing platform 2901 that includes a computer processor 2902, a memory 2904 (e.g., RAM, cache memory, flash memory, etc.), one or more storage devices 2906 (e.g., a solid state drive, a hard disk drive, an optical drive such as a compact disk (CD) drive or digital versatile disk (DVD) drive, a flash memory stick, etc.) and numerous other elements and functionalities. The computer processor 2902 may be an IC for processing instructions. For example, the computer processor 2902 may be one or more cores, or micro-cores of a processor. Components of the computing system 2900 can communicate over a data bus 2908.

The computing system 2900 may also include an input device 2910, such as any combination of one or more of a touchscreen, keyboard, mouse, microphone, touchpad, electronic pen, or any other input device. Further, the computing system 2900 can include an output device 2912, such as one or more of a screen (e.g., light emitting diode (LED) display, an organic light emitting diode (OLED) display, a liquid crystal display (LCD), a plasma display, touchscreen, cathode ray tube (CRT) monitor, projector, or other display device), a printer, external storage, or any other output device. In some examples, such as a touch screen, the output device 2912 can be the same physical device as the input device 2910. In other examples, the output device 2912 and the input device 2910 can be implemented as separate physical devices. The computing system 2900 can be coupled to a network 2914 (e.g., a local area network (LAN), a wide area network (WAN) such as the Internet, a mobile network, or any other type of network) via a network interface (not shown). The input device 2910 and output device(s) 2912 can be coupled locally and/or remotely (e.g., via the network 2914) to the computer processor 2902, the memory 2904, and/or the storage device 2906. Many different types of computing systems exist, and the input device 2910 and the output device 2912 can take other forms.

Software instructions in the form of computer readable program code to perform embodiments disclosed herein can be stored, in whole or in part, temporarily or permanently, on a non-transitory computer readable medium such as a CD, DVD, Blu-ray, storage device, a diskette, a tape, flash memory, physical memory, or any other computer readable storage medium. Specifically, the software instructions can correspond to computer readable program code that when executed by a processor, is configured to perform operations disclosed herein. The computing system 400 can communicate with a server 2916 via the network 2914. The memory 2904 can include a plurality of EDA applications that can be employed to generate an IC design and/or execute a simulation of the circuit design, and verification (e.g., functional verification). More particularly, the memory 2904 can include a scan chain tool 2918 for scan chain stitching as described herein, and an IC test engine 2920 similar to the scan chain tool 120 and the IC test engine 124, as shown in FIG. 1.

Further, one or more elements of the computing system 2900 can be located at a remote location and coupled to the other elements over the network 2914. Additionally, some examples can be implemented on a distributed system having a plurality of nodes, where each portion of an embodiment can be located on a different node within the distributed system. In one example, the node in the example of FIG. 4 corresponds to a distinct computing device. Alternatively, the node can correspond to a computer processor with associated physical memory. The node can alternatively correspond to a computer processor or micro-core of a computer processor with shared memory and/or resources.

FIG. 30 is an example of a portion of pseudocode 3000 that can be implemented by scan chain tool, such as the scan chain tool 120, as shown in FIG. 1, or the scan chain tool 2918, as shown in FIG. 29. Therefore, reference can be made to the example of FIGS. 1 and 29 in the example of FIG. 30. The pseudocode 3000 can be a high-level language code representation of at least some of the instructions stored in the memory 108 or the memory 2904 for implementing the scan chain tool 120.

For example, at 3002, the pseudocode 3000 corresponds to retrieving scan chain elements for different partitions (e.g., partitions A and B) from a scan element space, such as the scan chain element space 140, as shown in FIG. 1. At 3004, the pseudocode 3000 includes creating scan groups. At 3006, the pseudocode 3000 includes creating scan groups for other modes including particular scan chain elements (e.g., wrappers). The pseudocode 3000 at 3002, 3004, and 3006 can be implemented by the scan chain element grouping module 132, as shown in FIG. 1. At 3008, the pseudocode 3000 includes scan chain group assignment, balancing, and connection for each test mode. An assignment of scan chain groups and balancing of scan chain groups across scan chains at 3008 can be implemented by the scan chain balancing module 134, as shown in FIG. 1. Connecting of scan chains for each scan chain for each test mode can be implemented by the scan chain stitching module 136, as shown in FIG. 1.

What has been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. A computer-implemented method for forming scan chains for a test mode among a plurality of test modes of an integrated circuit, comprising:
    identifying scan chain elements in a design of the integrated circuit associated with the test mode, wherein the scan chain elements comprise integrated circuit elements that are configured to be connected together into scan chains;
    grouping the scan chain elements based on scan chain element grouping criteria into a plurality of scan chain groups;
    identifying a number of scan chains for the test mode;
    assigning each scan chain to one of the plurality of scan chain groups;
    balancing scan chain elements within each of the plurality of scan chain groups among the scan chains assigned to the each scan chain group, wherein balancing includes reducing a difference between numbers of scan chain elements in each scan chain assigned to the each scan chain group; and
    connecting scan chain elements to form the number of scan chains for the test mode in response to the scan chain element balancing.

2. The computer-implemented method of claim 1, wherein assigning the scan chains comprises:
    assigning a subset of the scan chains to a respective scan chain group of the scan chain groups;
    computing an average chain length for each scan chain group of the scan chain groups; and
    assigning a given scan chain of remaining scan chains of the scan chains other than the subset of the scan chains to a corresponding scan chain group having a greatest average chain length among the scan chain groups.

3. The computer-implemented method of claim 2, wherein computing the average chain length and the assigning of the given scan chain is repeated until each scan chain of the remaining scan chains has been assigned to a given scan chain group.

4. The computer-implemented method of claim 2, wherein the average chain length is computed based on a number of scan chain elements in a respective scan chain group and a number of scan chains.

5. The computer-implemented method of claim 3, wherein the balancing the scan chain elements comprises assigning scan chain elements associated with respective scan chain groups in a round-robin order to assign each scan chain element to one of the respective scan chain groups.

6. The computer-implemented method of claim 5, wherein the scan chain group is a first set of scan chain groups, and the scan chains is a first set of scan chains for a first one of the plurality of test modes, the scan chain data identify a second set of scan chains for a second one of the plurality of test modes, and the method further comprising:
    assigning an index value to the scan chain elements associated with the first set of scan chains;
    sorting the scan chain elements associated with the first set of scan chains based on the respective assigned index value to provide a sorted set of scan chain elements; and
    assigning at least some of the sorted set of scan chain elements to a respective scan chain of the second set of scan chains.

7. The computer-implemented method of claim 6, further comprising connecting the at least some of the sorted set of scan chain elements assigned to the second set of scan chains to form respective scan chain data test paths.

8. The computer-implemented method of claim 7, further comprising:
    identifying neighboring multi-mode mux elements for a shared wrapper in the scan chain circuitry for the at least some of the sorted set of scan chain elements;
    selecting a given multi-mode mux element from the neighboring multi-mode mux elements;
    removing a remaining multi-mode mux element of the neighboring multi-mode mux elements from the scan chain circuitry in response to selecting the given multimode mux element; and
    inserting an OR gate element into the scan chain circuitry.

9. The computer-implemented method of claim 8, further comprising:
    coupling an output of the OR gate element to the given multi-mode mux element to enable the OR gate element:
    during the first test mode to provide a first scan chain data test path between a first upstream scan chain element and a down stream chain element in the scan chain circuitry in response to a first enable signal received at a first input of the OR gate element; and
    during the second test mode to provide a second scan chain data test path between a second upstream scan chain element and the down stream chain element in the scan chain circuitry in response to a second enable signal received at a second input of the OR gate element.

10. The computer-implemented method of claim 9, wherein the first and second test modes is one of a compression mode, a full scan mode, or a serial mode.

11. The computer-implemented method of claim 10, wherein the scan chain element grouping criteria identifies power domains, clock domains, and/or clock edges parameters for grouping the first set of scan chain elements.

12. A system comprising:
    a non-transitory computer-readable medium configured to store data, and instructions;
    a processor configured to access the non-transitory computer-readable medium and execute the instructions, the instructions comprising:
        a scan chain element grouping module programmed to group scan chain elements based on scan chain element grouping criteria into a plurality of scan chain groups, wherein the scan chain elements comprise integrated circuit elements that are configured to be connected together into scan chains;
        a scan chain balancing module programmed to generate a plurality of balanced scan chains that have been assigned to the plurality of scan chain groups based on a number of scan chains received at a user input device, wherein balancing includes reducing a difference between numbers of scan chain elements in each scan chain assigned to the each scan chain group; and
        a scan chain stitching module programmed to stitch scan chain elements for each associated scan chain to form the number of balanced chains.

13. The system of claim 12, wherein the scan chain balancing module is programmed to:
    scan chain balance the scan chains across the scan chain groups to assign each scan chain to one of the scan chain groups; and scan chain element balance scan chain elements associated with each scan chain, wherein the balanced scan chain data is generated based on the scan chain and scan chain element balancing.

14. The system of claim 13, wherein the scan chain balancing module is programmed to scan chain element balance the scan chain element to:
    assign a subset of the scan chains to a respective scan chain group of the scan chain groups;
    compute an average chain length for each scan chain group of the scan chain groups; and
    assign a given scan chain of remaining scan chains of the scan chains to a corresponding scan chain group having a greatest average chain length among the scan chain groups, wherein the computing the average chain length and the assigning of the given scan chain is repeated until each scan chain of the remaining scan chains has been assigned to a given scan chain group.

15. The system of claim 14, wherein the scan chain element balancing the scan chain elements comprises assigning scan chain elements associated with respective scan chain groups in a round-robin order to assign each scan chain element to one of the respective scan chain groups.

16. The system of claim 15, wherein the scan chain group is a first set of scan chain groups, and the scan chains is a first set of scan chains for a first test mode, the scan chain data identify a second set of scan chains for a second test mode, and the scan chain balancing module is programmed to
    assign an index value to the scan chain elements associated with the first set of scan chains;
    sort the scan chain elements associated with the first set of scan chains based on the respective assigned index value to provide a sorted set of scan chain elements; and
    assign at least some of the sorted set of scan chain elements to a respective scan chain of the second set of scan chains.

17. The system of claim 16, wherein the scan chain stitching module is programmed to connect the at least some of the sorted set of scan chain elements assigned to the second set of scan chains to form respective scan chain data test paths that include at least one allocated multi-mode mux element of the allocated multi-mode mux elements.

18. The system of claim 17, wherein the scan chain stitching module is programmed to:
    identify neighboring multi-mode mux elements for a shared wrapper in the scan chain circuitry for the at least some of the sorted set of scan chain elements;
    select a given multi-mode mux element from the neighboring multi-mode mux elements;
    remove a remaining multi-mode mux element of the neighboring multi-mode mux elements from the scan chain circuitry in response to selecting the given multi-mode mux element;
    insert an OR gate element into the scan chain circuitry; and
    couple an output of the OR gate element to the given multi-mode mux element.

19. A non-transitory machine readable medium having machine executable instructions, the machine executable instructions comprising a scan chain tool, the scan chain tool comprising:
    a scan chain element grouping module to group scan chain elements based on scan chain element grouping criteria into a plurality of scan chain groups, wherein the scan chain elements comprise integrated circuit elements that are configured to be connected together into scan chains;
    a scan chain balancing module to, based on a number of scan chains:
        assign each scan chain to one of the scan chain groups;
        balance scan chain elements within each scan chain group among the scan chains assigned to the each scan chain group, wherein balancing includes reducing a difference between numbers of scan chain elements in each scan chain assigned to the each scan chain group; and
    a scan chain stitching module to stitch scan chain elements for each associated scan chain to form the number of scan chains.

20. The non-transitory machine readable medium of claim 18, wherein the scan chain stitching module is to:
    allocate multi-mode mux elements to scan chain elements assigned to the scan chains;
    identify neighboring multi-mode mux elements for a shared wrapper in the scan chain circuitry for the at least some of the sorted set of scan chain elements;
    select a given multi-mode mux element from the neighboring multi-mode mux elements;
    remove a remaining multi-mode mux element of the neighboring multi-mode mux elements from the scan chain circuitry in response to selecting the given multi-mode mux element;
    insert an OR gate element into the scan chain circuitry; and
    couple an output of the OR gate element to the given multi-mode mux element.

* * * * *